(12) United States Patent
Vimercati

(10) Patent No.: US 10,839,882 B2
(45) Date of Patent: Nov. 17, 2020

(54) DUAL MODE FERROELECTRIC MEMORY CELL OPERATION

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/184,300

(22) Filed: Nov. 8, 2018

(65) Prior Publication Data
US 2019/0122718 A1    Apr. 25, 2019

Related U.S. Application Data

(62) Division of application No. 15/618,393, filed on Jun. 9, 2017, now Pat. No. 10,153,020.

(51) Int. Cl.
| | |
|---|---|
| *G11C 11/22* | (2006.01) |
| *G11C 11/00* | (2006.01) |
| *G11C 14/00* | (2006.01) |

(52) U.S. Cl.
CPC ........ *G11C 11/2273* (2013.01); *G11C 11/005* (2013.01); *G11C 11/221* (2013.01); *G11C 11/2275* (2013.01); *G11C 11/2293* (2013.01); *G11C 14/0027* (2013.01)

(58) Field of Classification Search
CPC ............ G11C 11/2273; G11C 11/2275; G11C 11/2293; G11C 11/005; G11C 11/221; G11C 14/002
USPC ........................................................ 365/145
See application file for complete search history.

(56) References Cited

U.S. PATENT DOCUMENTS

| | | | |
|---|---|---|---|
| 5,297,077 A | * | 3/1994 | Imai ................. G11C 14/00 365/117 |
| 5,539,279 A | | 7/1996 | Takeuchi et al. |
| 5,680,344 A | | 10/1997 | Seyyedy |
| 5,828,596 A | | 10/1998 | Takata et al. |
| 7,466,586 B2 | | 12/2008 | Kim |
| 7,599,207 B2 | | 10/2009 | Sakuma |

(Continued)

FOREIGN PATENT DOCUMENTS

| | | |
|---|---|---|
| EP | 0631287 A2 | 12/1994 |
| JP | 3741232 B2 | 11/2005 |

OTHER PUBLICATIONS

Intellectual Property Office, "Office Action," issued in connection with ROC (Taiwan) Pat. Appln. No. 107119910, dated Oct. 25, 2019 (3 pages).

*Primary Examiner* — Fernando Hidalgo
(74) *Attorney, Agent, or Firm* — Holland & Hart LLP

(57) ABSTRACT

Methods, systems, and devices for dual mode ferroelectric memory cell operation are described. A memory array or portions of the array may be variously operated in volatile and non-volatile modes. For example, a memory cell may operate in a non-volatile mode and then operate in a volatile mode following a command initiated by a controller while the cell is operating in the non-volatile mode. The memory cell may operate in the volatile mode and then operate in the non-volatile mode following a subsequent command. In some examples, one memory cell of the memory array may operate in the non-volatile mode while another memory cell of the memory array operates in the volatile mode.

15 Claims, 14 Drawing Sheets

(56) References Cited

U.S. PATENT DOCUMENTS

| | | |
|---|---|---|
| 9,368,182 B2 | 6/2016 | Mueller |
| 9,768,181 B2 | 9/2017 | Chavan et al. |
| 10,283,181 B2 * | 5/2019 | Toops ................. G11C 11/2275 |
| 2007/0053220 A1 | 3/2007 | Gohou |
| 2014/0012342 A1 | 1/2014 | Penner et al. |
| 2017/0243857 A1 * | 8/2017 | Hwang ............... H01L 25/0655 |
| 2017/0278573 A1 | 9/2017 | Yu et al. |
| 2018/0033486 A1 * | 2/2018 | Chen .................. G11C 14/0072 |
| 2018/0301188 A1 | 10/2018 | Choi et al. |

* cited by examiner

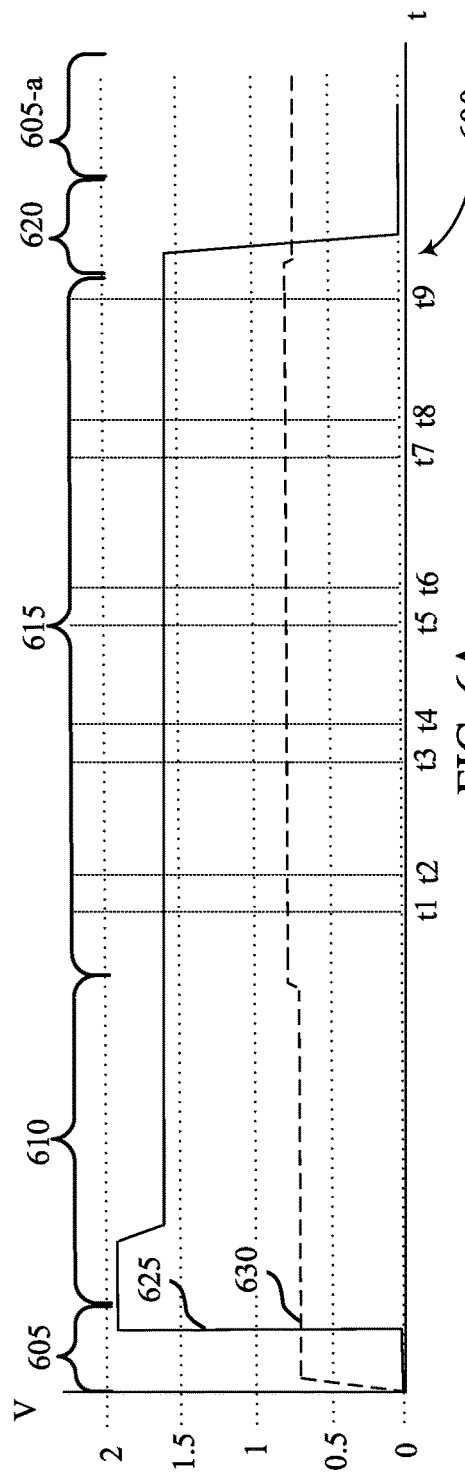
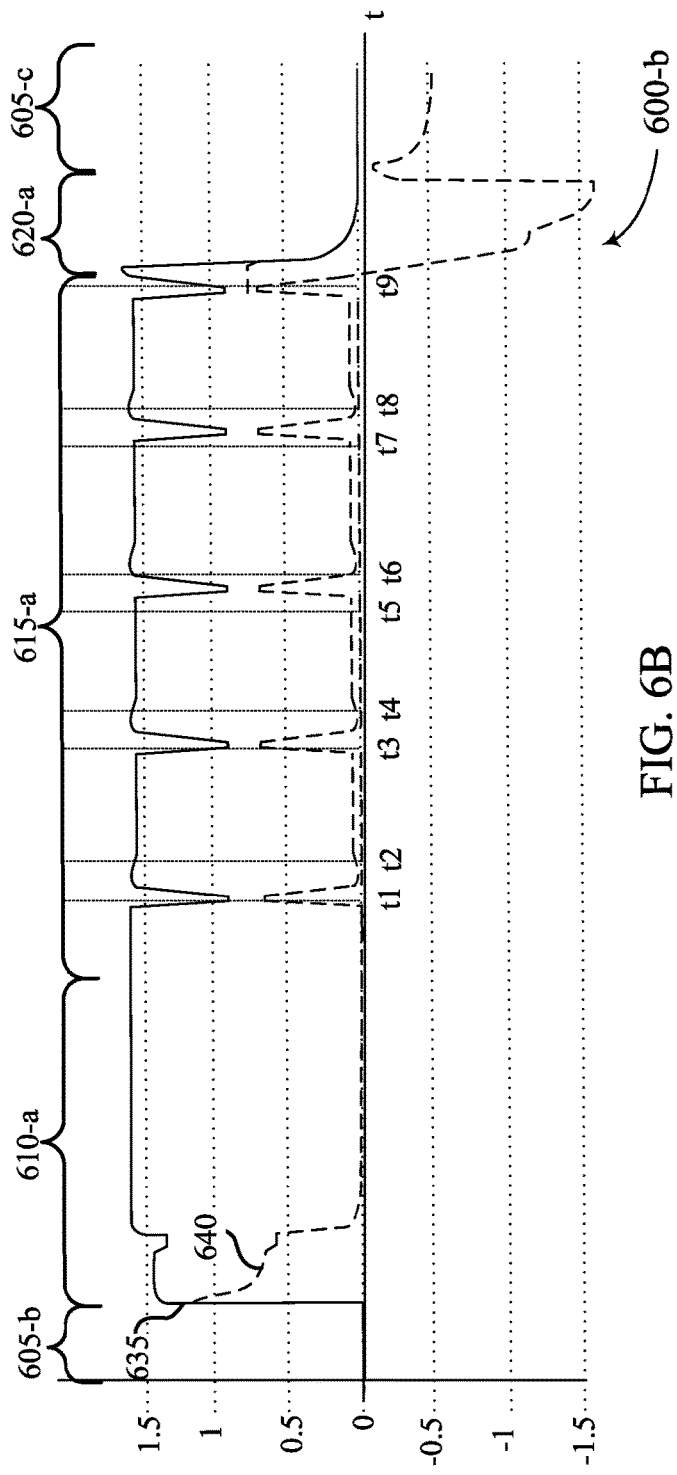
FIG. 6A
FIG. 6B

DUAL MODE FERROELECTRIC MEMORY CELL OPERATION

CROSS REFERENCE

The present Application for Patent is a divisional of and claims priority to and the benefit of U.S. patent application Ser. No. 15/618,393 by Vimercati, entitled "Dual Mode Ferroelectric Memory Cell Operation," filed Jun. 9, 2017, assigned to the assignee hereof, and each of which is expressly incorporated by reference in its entirety herein.

BACKGROUND

The following relates generally to operating a memory array and more specifically to dual mode ferroelectric memory cell operation.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. In some cases, there may be different memory technologies for volatile data storage and non-volatile data storage. In some examples, a ferroelectric memory device may be configured to operate in a non-volatile mode or a volatile, but cannot dynamically alternate between the two. For example, non-volatile data storage may not occur when a ferroelectric memory device operates in the volatile mode. Similarly, volatile data storage may not occur when a ferroelectric memory device operates in the non-volatile mode. Operations performed in the non-volatile mode may require more time, and operations performed in a volatile mode may lose content during a change in power. These problems may slow or disrupt operations of the memory cell when a non-volatile mode is preferred over a volatile mode or vice versa.

BRIEF DESCRIPTION OF THE DRAWINGS

FIG. 6A-6B illustrates example voltage plots for a memory cell that that supports dual mode ferroelectric memory cell operation in accordance with examples of the present disclosure.

DETAILED DESCRIPTION

Figure 1:
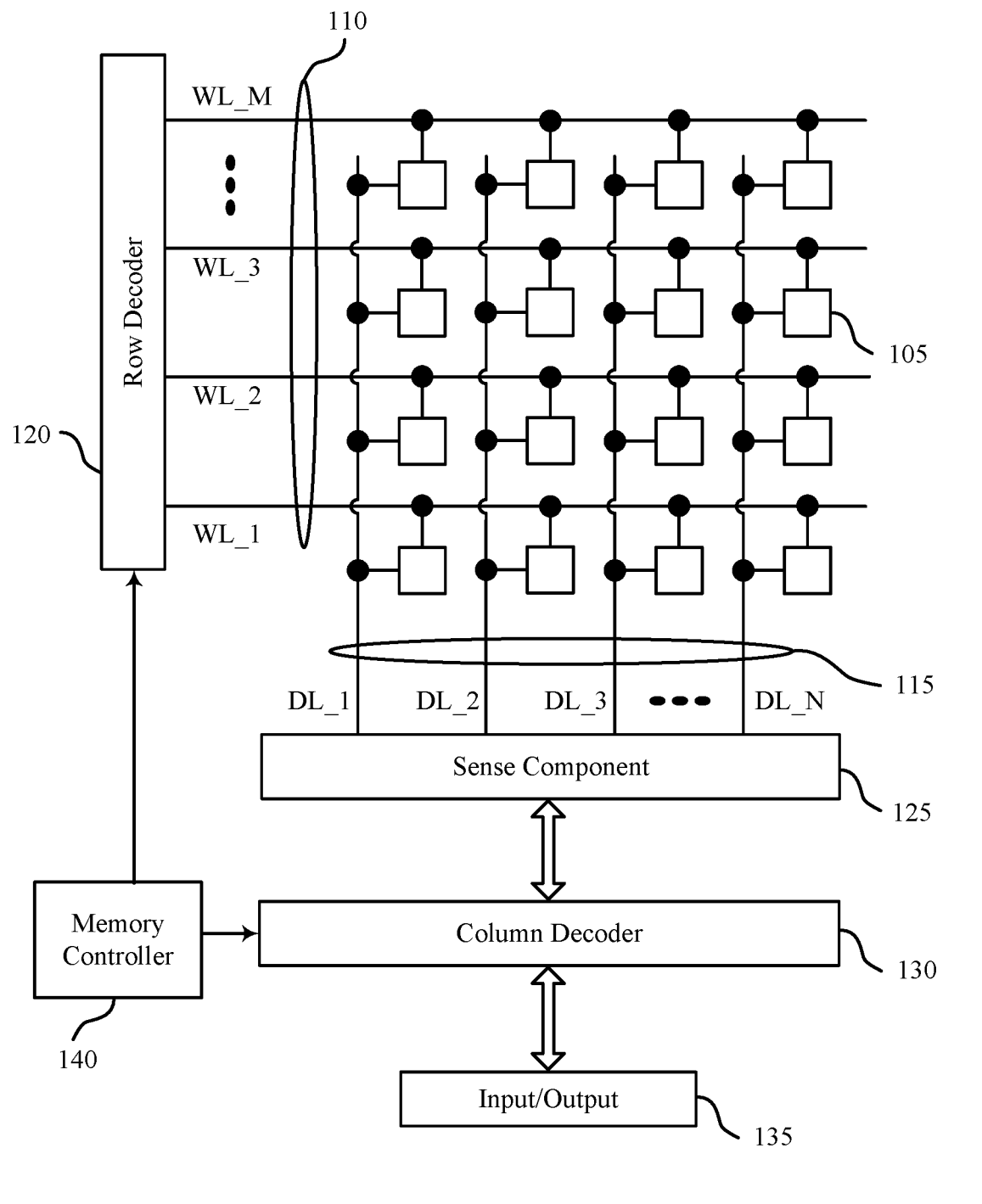
FIG. 1 illustrates an example of a memory array that supports dual mode ferroelectric memory cell operation in accordance with examples of the present disclosure.

A memory array may contain memory cells that perform a sequence of operations in a non-volatile mode or a volatile mode, or both. In some examples, a memory cell (e.g., a ferroelectric memory cell) operating in a volatile mode may perform operations (e.g., a sense operation, a read operation) faster than a memory cell operating in a non-volatile mode. As described herein, techniques for dynamically variable operation a memory cell in a volatile mode or a non-volatile mode, or both, at different times provides for advantages, including operating within the expected specifications for volatile memory and non-volatile memory. In some cases, a memory cell operating in a non-volatile mode may perform the same operation. In other cases, a memory cell operating in a volatile mode may lose content in the memory array during a change in power while a memory cell operating in a non-volatile mode may retain the content in the memory array. This loss in memory array content may disrupt operations of the memory cell or other components.

As described herein, one or more memory cells of a memory array may switch between a non-volatile mode of operation and a volatile mode of operation based on the desired functionality for the memory cell or the operations to be performed. For example, a memory cell may perform operations in a non-volatile mode during a power change to retain the content in the memory array. In other examples, a memory cell may perform operations in a volatile mode when the operation requires less access time or faster performance. Non-volatile modes of operation may require more time to perform some operations as compared to volatile modes of operation; however, power may be saved in the non-volatile mode by not implementing refresh operations in the memory array.

In some examples, the memory device may switch between non-volatile and volatile modes of operation according to variable latency. For example, the memory array operating in a volatile mode may require a refresh operation. In some cases, a refresh operation may be performed after the memory cell has switched from the non-volatile mode to the volatile mode. In other cases, a longer refresh operation may be implemented in the non-volatile mode of operation.

One or more components in electronic communication with the memory array or the memory array itself may issue a command to switch the memory cells between non-volatile and volatile modes of operation. For example, a first command to switch the memory cell from a non-volatile mode of operation to a volatile mode of operation may be issued. After the first command is issued, a first portion of the memory array may be selected, the memory cell content (e.g., a first logic state) stored during the non-volatile mode may be sensed, and the memory cell content may be stored in a storage component.

In other examples, one or more components in electronic communication with the memory array or the memory array itself may issue a second command to switch from a volatile mode of operation to a non-volatile mode of operation. After the second command is issued, the memory cell content (e.g., a second logic state) stored during the volatile mode may be sensed, stored in a storage component, and a portion of the memory array may be deselected. In some examples, the memory cell may write-back the second logic state into the same capacitor that was previously used in the non-volatile mode of operation or into another storage component.

Features of the disclosure introduced above are further described below in the context of FIG. 1. Specific examples are then described for FIGS. 2-5D. These and other features of the disclosure are further illustrated by and described with reference to apparatus diagrams, system diagrams, and flowcharts that relate to dual mode ferroelectric memory cell operation.

FIG. 1 illustrates an example memory array 100 that supports dual mode ferroelectric memory cell operation in accordance with examples of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W)), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. In some examples, other lines (not shown in FIG. 1) may be present. For example, plate lines—discussed below in reference to other figures—may be coupled to memory cells 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written. In some examples, a write-back operation may occur during a pre-charge state using non-volatile timings.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some cases, when memory cells 105 operate in the non-volatile mode, the memory controller 140 may initiate a first command to memory cells 105. The memory controller 140 may also sense the logic state of active memory cells 105, store the logic state to their respectively paired sense component 125, and operate the memory cell 105 in a volatile mode (i.e., when the memory cell 105 in a portion of the memory array 100 may be switched from operating in the non-volatile mode to operating in the volatile mode). In some examples, when memory cells 105 operate in the volatile mode, the memory controller 140 may initiate a second command to memory cells 105. The memory controller 140 may also sense the logic state of active memory cells 105, store the logic state to their respectively paired sense component 125, and operate the memory cell 105 in non-volatile mode.

Figure 2:
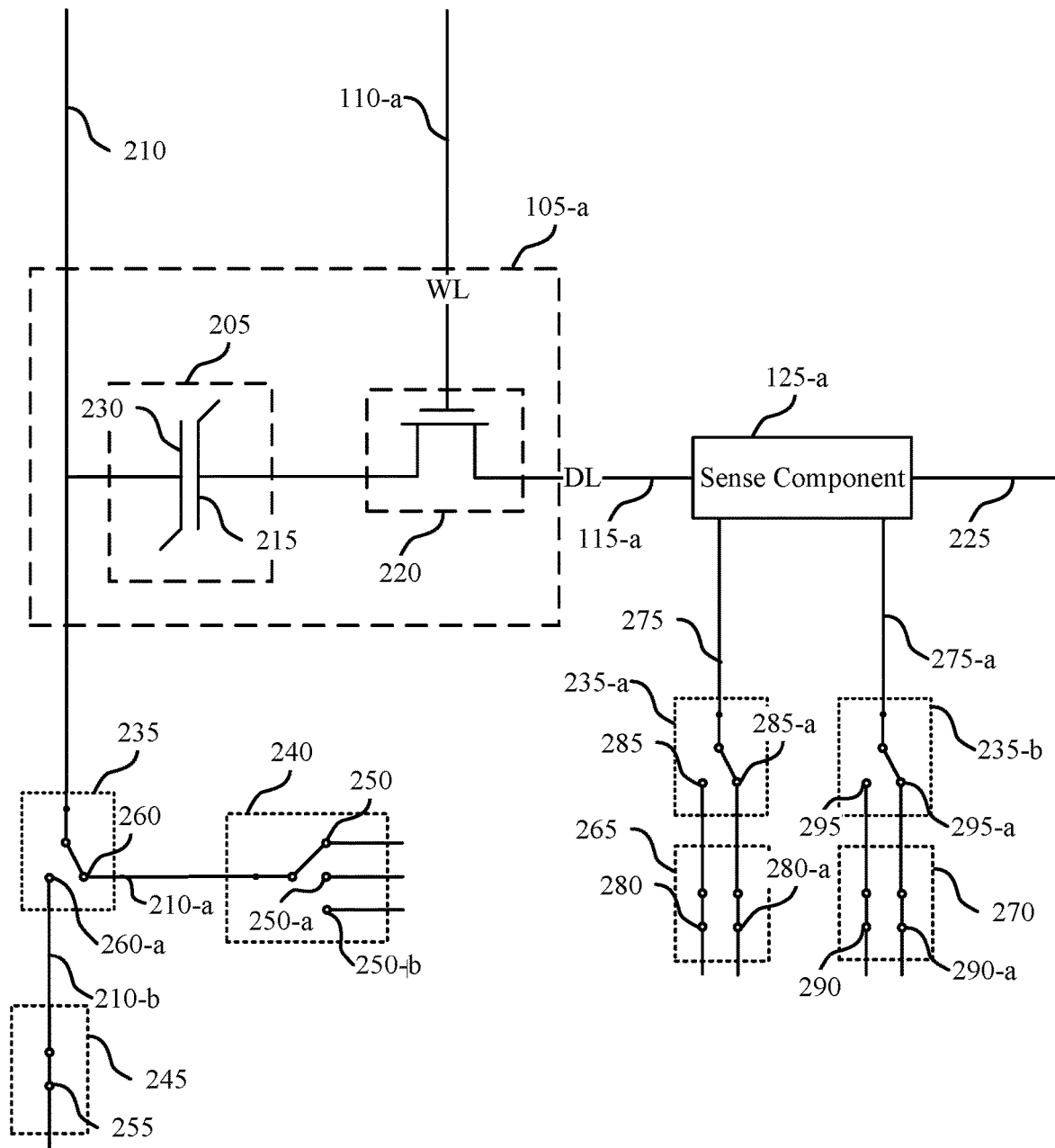
FIG. 2 illustrates an example circuit of a memory cell that supports dual mode ferroelectric memory cell operation in accordance with examples of the present disclosure.

FIG. 2 illustrates an example circuit 200 of a memory cell that supports dual mode ferroelectric memory cell operation in accordance with examples of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-*a* by varying the voltage to cell plate 230 may be referred to as "moving cell plate."

In some examples, the cell plate 230 may be cut in horizontal lines according to the direction of word line 110-*a*. For example, horizontal cuts may increase power to memory cell 105-*a* by the ability to move a portion of the plate instead of the full plate sheet. In some examples, a full plate sheet may be used. In some cases, when a second command is issued a full plate sheet may be used if a negative voltage is used to deselect word line 110-*a*. In some cases, if a reference voltage for a non-volatile operation is supplied to memory cell 105-*a*, plate line 210 may operate in the non-volatile pre-charge timings. In other examples, plate line 210 may remain at a high voltage during a accessing operation (e.g., a write operation) when memory cell 105-*a* operates in the volatile mode.

The change in voltage of digit line 115-*a* may depend on its intrinsic capacitance. That is, as charge flows through digit line 115-*a*, some finite charge may be stored in digit line 115-*a* and the resulting voltage depends on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 225) by sense component 125-*a* in order to determine the stored logic state in memory cell 105-*a*. Other sensing processes may be used. For example, a charge on capacitor 205 may be sensed independently of whether the memory cell is operating in the volatile or non-volatile mode. In some examples, a voltage signal may be induced on access line 110 based on the amount of charge stored by capacitor 205. In some cases, sense component 125-*a* may determine the corresponding logic value based on the voltage signal. In some cases, the sensing scheme may be used for the volatile mode of operation, or the non-volatile mode of operation, or both.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference line 225, which may be a reference voltage. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage. In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

As described herein, a reference voltage, which may be associated with reference line 225, may be used to read memory cell 105-*a* operating in the non-volatile mode and a different reference voltage may be used to read memory cell 105-*a* operating in the volatile mode. For example, memory cell 105-*a* may be pre-charged using a different reference voltage when memory cell 105-*a* may operate in the volatile mode compared to when memory cell 105-*a* may operate in the non-volatile mode. In some examples, the voltage across memory cell 105-*a* may be 0 volts, or the voltage across memory cell 105-*a* may be the supply voltage provided by sense component 125-*a*. In other examples, memory cell 105-*a* may supply +½ of the supply voltage to the sense component 125-*a* for one logic state (e.g., writing a "0") and −½ of the supply voltage for the other logic state (e.g., writing a "1"). Therefore, the absolute voltage across the memory cell 105-*a* may be different based on the reference voltage applied to memory cell 105-*a*.

In some cases, the content in memory cell 105-*a* may be lost when memory cell 105-*a* switches from a non-volatile mode of operation to a volatile mode of operation. In some examples, word line 110-*a* may require a deselection voltage in the portion of the memory array that may switch from non-volatile mode of operation to volatile mode of operation and vice versa. For example, the content of memory cell 105-*a* that may operate in the non-volatile mode may be lost without a negative deselection voltage.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high. In some examples, word line 110-*a* may be deselected after capacitor 205 is biased to store data in the volatile mode. In other examples, word line 110-*a* may be deselected after capacitor 205 is biased to zero volts (0V) when memory cell 105-*a* operates in the non-volatile mode.

Circuit 200 also includes mode switch 235, first voltage switch 240, and second voltage switch 245. Memory cell 105-*a* may be in electronic communication with first voltage switch 240 through plate line 210-*a*, and mode switch 235 may be positioned in series with plate line 210-*a* and electrically connect or isolate memory cell 105-*a* from first voltage switch 240. Memory cell 105-*a* may also be in electronic communication with second voltage switch 245 through plate line 210-*b*, and mode switch 235 may be positioned in series with plate line 210-*b* and electrically connect or isolate memory cell 105-*a* from second voltage switch 245.

First voltage switch 240 may include nodes 250, 250-*a*, and 250-*b*. For example, node 250 may provide a read voltage to operate memory cell 105-*a* in the non-volatile mode, node 250-*a* may provide a supply voltage to operate memory cell 105-*a* in the non-volatile mode, and node 250-*b* may provide a ground voltage to operate memory cell 105-*a* in the non-volatile mode. Second voltage switch 245 may include node 255. For example, node 255 may provide a supply voltage to operate memory cell 105-*a* in the volatile mode. Mode switch 235 may include nodes 260 and 260-*a*. For example, node 260 electrically connects memory cell 105-*a* to first voltage switch 240 and node 260-*a* electrically connects memory cell 105-*a* to second voltage switch 245.

As described herein, the memory array may issue a first command, and mode switch 235 may be closed to electrically connect memory cell 105-a to first voltage switch 240. In such cases, memory cell 105-a may operate in the volatile mode. In other examples, 10 the memory array may issue a second command, and mode switch 235 may be closed to electrically connect memory cell 105-a to second voltage switch 245. In such cases, memory cell 105-a may operate in the non-volatile mode.

Circuit 200 also includes timing component 265, mode switch 235-a, voltage component 270, and mode switch 235-b. Sense component 125-a may be in electronic communication with timing component 265 through conductive line 275, and mode switch 235-a may be positioned in series with conductive line 275 and electrically connect or isolate timing component 265 from sense component 125-a. Sense component 125-a may also be in electronic communication with voltage component 270 through conductive line 275-a, and mode switch 235-b may be positioned in series with conductive line 275-a and electrically connect or isolate voltage component 270 from sense component 125-a.

In some examples, timing component 265 may provide timing specifications for sense component 125-a to determine the mode of operation of memory cell 105-a at a first time. For example, node 280 may provide a timing specification to operate memory cell 105-a in the non-volatile mode. In other examples, node 280-a may provide a timing specification to operate memory cell 105-a in the volatile mode. In some examples, the mode of operation of memory cell 105-a may be determined based on a flag written to memory cell 105-a or available to the memory controller or the memory array. In other examples, the mode of operation of memory cell 105-a may be determined based on a table located in memory cell 105-a or available to the memory controller or the memory array via one or more electronic connections, where the table may be updated with additional information. In some examples, the mode of operation of memory cell 105-a may be determined based on a command, a flag, a table including information, or a combination thereof. Mode switch 235-a may include nodes 285 and 285-a. For example, node 285 electrically connects sense component 125-a to node 280 when memory cell 105-a operates in a non-volatile mode. In other examples, node 285-a electrically connects sense component 125-a to node 280-a when memory cell 105-a operates in a volatile mode.

In some examples, voltage component 270 may provide a reference voltage for sense component 125-a to determine the logic state of memory cell 105-a. For example, node 290 may provide a reference voltage to operate memory cell 105-a in the non-volatile mode. In other examples, node 290-a may provide a reference voltage to operate memory cell 105-a in the volatile mode. Mode switch 235-b may include nodes 295 and 295-a. For example, node 295 electrically connects sense component 125-a to node 290 when memory cell 105-a operates in a non-volatile mode. In other examples, node 295-a electrically connects sense component 125-a to node 290-a when memory cell 105-a operates in a volatile mode.

Figure 3:
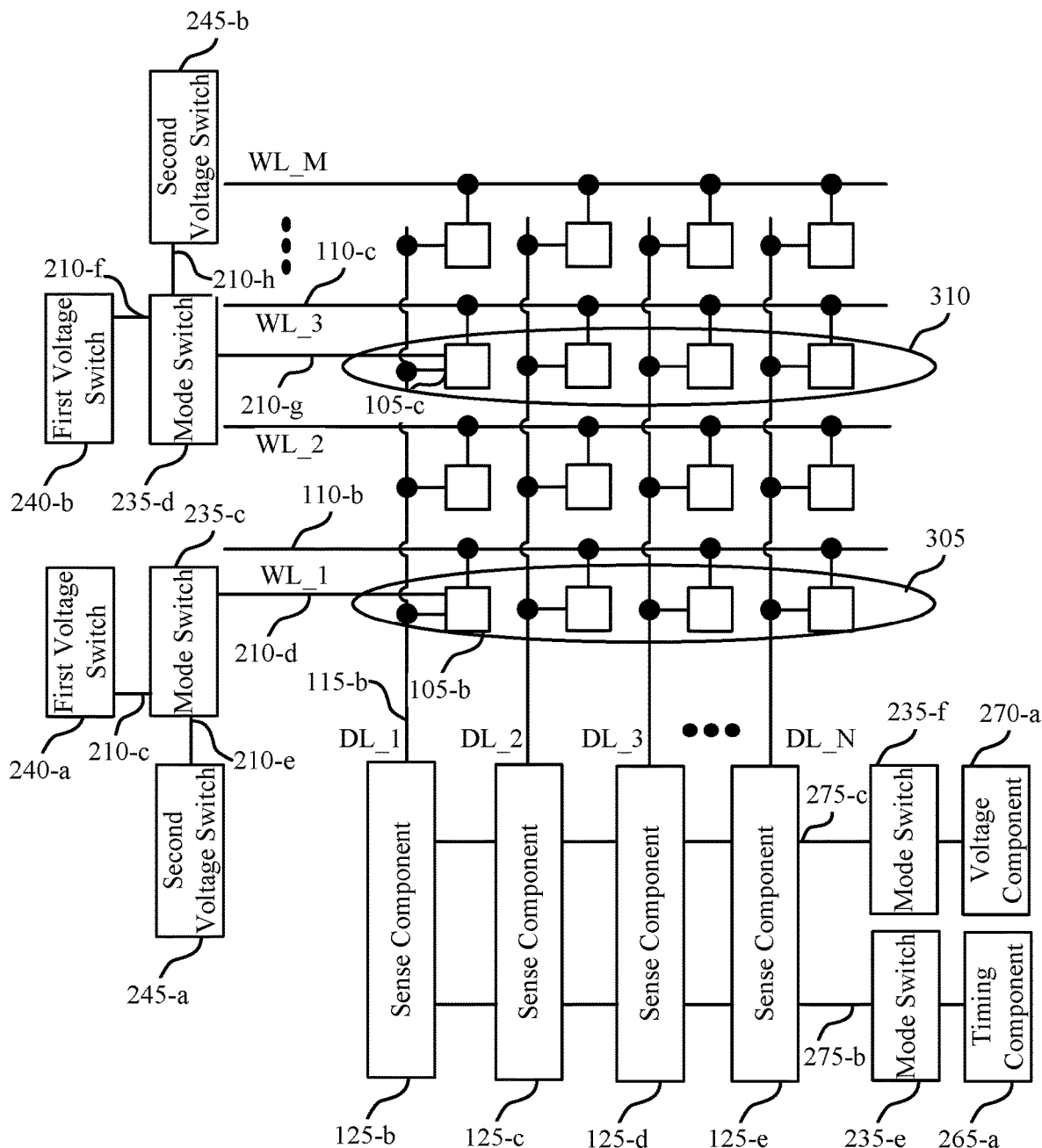
FIG. 3 illustrates an example memory array that supports dual mode ferroelectric memory cell operation in accordance with examples of the present disclosure.

FIG. 3 illustrates an example memory array 300 that supports dual mode ferroelectric memory cell operation in accordance with examples of the present disclosure. Memory array 300 may include multiple array sections, for example array sections 305 and 310. Array sections 305 and 310 may contain memory cells 105-b and 105-c, respectively, but may also each include a plurality of memory cells. In some examples, array section 305 contains memory cell 105-b, which may be connected to a common access line, such as word line 110-b. Word line 110-b may be an example of a word line 110 described with reference to FIGS. 1 and 2, and memory cell 105-b may be an example of memory cells 105 described with reference to FIGS. 1 and 2. In some examples, memory array 300 also includes sense components 125-b, 125-c, 125-d, and 125-e, which may be examples of a sense component 125 described with reference to FIGS. 1 and 2. Each memory cell 105 may be connected to a sense component 125 through a conductive digit line 115. For example, memory cells 105-b and 105-c may be in electronic communication with an active sense component 125-b through digit line 115-b. Memory array 300 also includes mode switches 235-c, 235-d, 235-e, and 235-f, which may be examples of mode switch 235 described with reference to FIG. 2.

Memory array 300 also includes first voltage switch 240-a and second voltage switch 245-a, which may be examples of first voltage switch 240 and second voltage switch 245, respectively, discussed with reference to FIG. 2. For example, first voltage switch 240-a may be in electronic communication with memory cell 105-b via plate lines 210-c and 210-d. Plate lines 210-c and 210-d may be an example of a plate line 210 described with reference to FIG. 2. In another example, second voltage switch 245-a may be in in electronic communication with memory cell 105-b via plate lines 210-e and 210-d. Mode switch 235-c may be positioned in series with plate lines 210-c and 210-e and electrically connect or isolate first voltage switch 240-a and second voltage switch 245-a, respectively, from memory cell 105-b.

Memory array 300 also includes first voltage switch 240-b and second voltage switch 245-b, which may be examples of first voltage switch 240 and second voltage switch 245, respectively, discussed with reference to FIG. 2. For example, first voltage switch 240-b may be in electronic communication with memory cell 105-c via plate lines 210-f and 210-g. Plate lines 210-f and 210-g may be an example of a plate line 210 described with reference to FIG. 2. In another example, second voltage switch 245-b may be in in electronic communication with memory cell 105-c via plate lines 210-h and 210-g. Mode switch 235-d may be positioned in series with plate lines 210-f and 210-h and electrically connect or isolate first voltage switch 240-b and second voltage switch 245-b, respectively, from memory cell 105-c. In some examples, plate line 210-g may be the same as plate line 210-d. For example, mode switch 235-c may be in electronic communication with memory cell 105-c via plate line 210-g. In other examples, mode switch 235-d may be in electronic communication with memory cell 105-b via plate line 210-d. In some examples, other configurations may be implemented in memory array 300 for embodiments different than example memory array 300 of FIG. 3.

As described in the present disclosure, memory array 300 may also include timing component 265-a and voltage component 270-a, which may be examples of timing component 265 and voltage component 270, respectively, discussed with reference to FIG. 2. For example, timing component 265-a may be in electronic communication with sense components 125-b through 125-e via conductive line 275-b. Conductive line 275-b may be an example of a conductive line 275 with reference to FIG. 2. Memory array 300 also includes mode switch 235-e positioned in series with timing component 265-a and sense component 125-e. Mode switch 235-e may be an example of mode switch 235, discussed with reference to FIG. 2. In another example, voltage component 270-a may be in electronic communication with sense components 125-*b* through 125-*e* via conductive line 275-*c*. Conductive line 275-*c* may be an example of a conductive line 275 with reference to FIG. 2. Memory array 300 also includes mode switch 235-*f* positioned in series the voltage component 270-*a* and the sense component 125-*d*. Mode switch 235-*f* may be an example of mode switch 235, discussed with reference to FIG. 2.

In some cases, memory array 300 may operate array section 305 in one mode while performing operations in array section 310 of the memory array 300 in a different mode. For example, memory cell 105-*b* in array section 305 may operate in the non-volatile mode while memory cell 105-*c* in array section 310 may operate in the volatile mode. That is, mode switch 235-*c* may comprise a transistor operable to couple the memory cell 105-*b* to first voltage switch 240-*a*, and mode switch 235-*d* comprises a transistor operable to couple the memory cell 105-*c* to second voltage switch 245-*b*. In some examples, memory cell 105-*b* in array section 305 may operate in the volatile mode while memory cell 105-*c* in array section 310 may operate in the volatile mode. That is, mode switch 235-*c* may comprise a transistor operable to couple the memory cell 105-*b* to the second voltage switch 245-*a*, and mode switch 235-*d* may comprise a transistor operable to couple the memory cell 105-*c* to the second voltage switch 245-*b*. In some examples, memory cell 105-*b* in array section 305 and memory cell 105-*c* in array section 310 may both operate in the same mode (e.g., either the volatile or non-volatile mode of operation).

In some cases, the memory cells in array section 305 may be connected to word line 110-*b* and may be selected and sensed at the same time. For example, when memory cell 105-*b* in array section 305 operates in the volatile mode, all the memory cells in array section 305 may be selected and sensed corresponding to the word line 110-*b*. Similarly, when memory cell 105-*c* in array section 310 operates in the non-volatile mode, all the memory cells in array section 310 may be selected and sensed corresponding to word line 110-*c*. In some cases, the cell content may be stored in a shorter word line 110-*b* (i.e., a portion of the word line 110-*b* may be used) when memory cell 105-*b* operates in the non-volatile mode as compared to when memory cell 105-*b* operates in the volatile mode. For example, when memory cell 105-*b* in array section 305 operates in the volatile mode, the entire word line 110-*b* may be used.

Figure 4A:
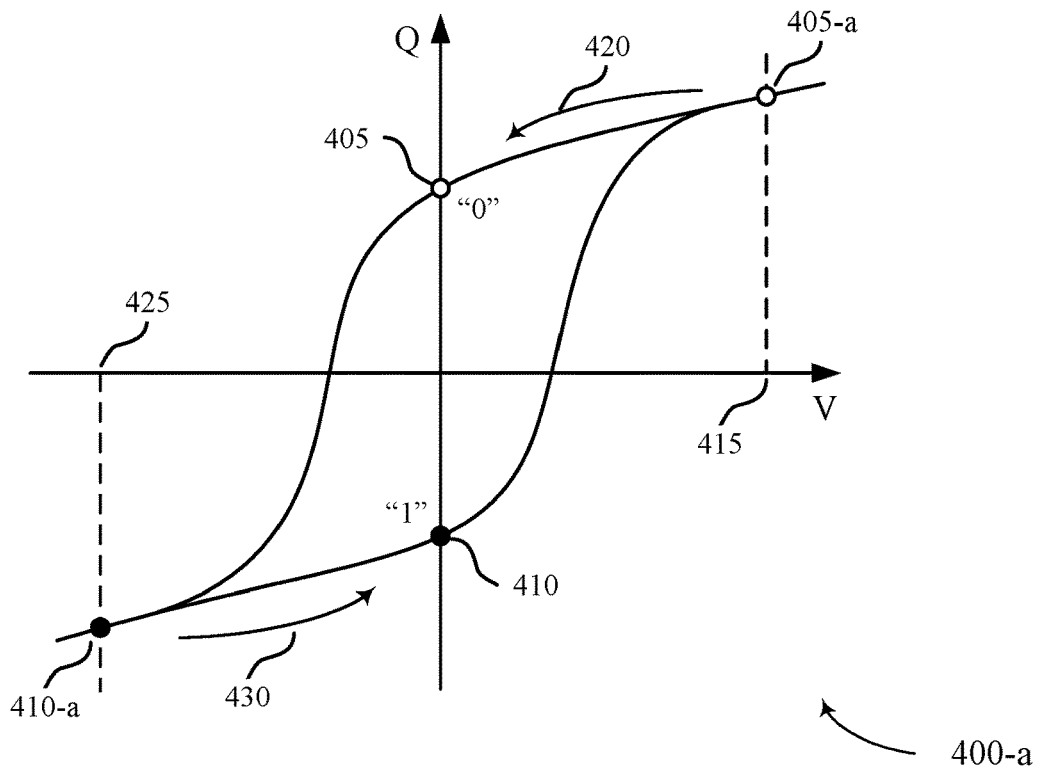
FIGS. 4A-4B illustrate example hysteresis plots for a memory cell that supports dual mode ferroelectric memory cell operation in accordance with examples of the present disclosure.
Figure 4B:
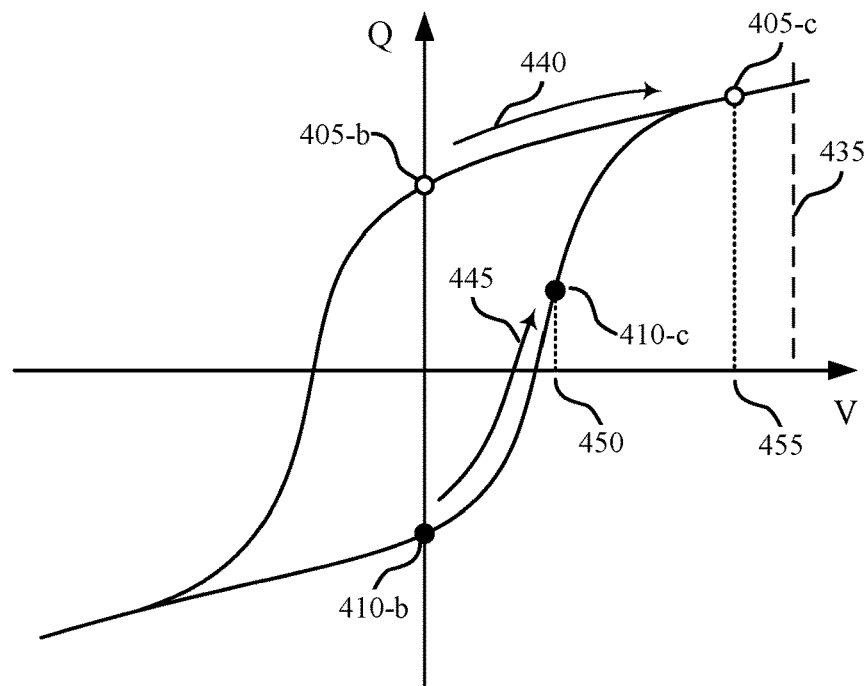

FIGS. 4A-4B illustrates an example of non-linear electrical properties with hysteresis plots 400-*a* and 400-*b* for a memory cell that supports dual mode ferroelectric memory cell operation in accordance with examples of the present disclosure. Hysteresis plots 400-*a* and 400-*b* illustrate an example ferroelectric memory cell writing and reading process, respectively. Hysteresis plots 400-*a* and 300-*b* depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis plots 400-*a* and 400-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis plots 400-*a* and 400-*b* represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis plots 400-*a* and 400-*b*.

As depicted in hysteresis plot 400-*a*, the ferroelectric material may maintain a positive or negative polarization with a zero voltage difference, resulting in two possible charged states: charge state 405 and charge state 410. According to the example of FIG. 4, charge state 405 represents a logic 0 and charge state 410 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 415 across the capacitor results in charge accumulation until charge state 405-*a* is reached. Upon removing voltage 415, charge state 405-*a* follows path 420 until it reaches charge state 405 at zero voltage. Similarly, charge state 410 is written by applying a net negative voltage 425, which results in charge state 410-*a*. After removing negative voltage 425, charge state 410-*a* follows path 430 until it reaches charge state 410 at zero voltage. Charge states 405-*a* and 410-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 405-*b* or 410-*b* was initially stored. For example, hysteresis plot 400-*b* illustrates two possible stored charge states 405-*b* and 410-*b*. Voltage 435 may be applied across the capacitor as discussed with reference to FIG. 2. In other cases, a fixed voltage may be applied to the cell plate and, although depicted as a positive voltage, voltage 435 may be negative. In response to voltage 435, charge state 405-*b* may follow path 440. Likewise, if charge state 410-*b* was initially stored, then it follows path 445. The final position of charge state 405-c and charge state 410-c depend on a number of factors, including the specific sensing scheme and circuitry.

In some cases, the final voltage may depend on the intrinsic capacitance of the digit line connected to the memory cell. For example, if the capacitor is electrically connected to the digit line and voltage 435 is applied, the voltage of the digit line may rise due to its intrinsic capacitance. So a voltage measured at a sense component may not equal voltage 435 and instead may depend on the voltage of the digit line. The position of final charge states 405-c and 410-c on hysteresis plot 401 may thus depend on the capacitance of the digit line and may be determined through a load-line analysis—i.e., charge states 405-c and 410-c may be defined with respect to the digit line capacitance. As a result, the voltage of the capacitor, voltage 450 or voltage 455, may be different and may depend on the initial state of the capacitor.

By comparing the digit line voltage to a reference voltage, the initial state of the capacitor may be determined. The digit line voltage may be the difference between voltage 435 and the final voltage across the capacitor, voltage 450 or voltage 455—i.e., (voltage 435-voltage 450) or (voltage 435-voltage 455). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 435-voltage 450) and (voltage 435-voltage 455). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 405-b is stored, the charge state may follow path 440 to charge state 405-c during a read operation and, after removing voltage 435, the charge state may return to initial charge state 405-b by following path 440 in the opposite direction.

FIG. 5A-5D illustrates example hysteresis plots 500-a, 500-b, 500-c, and 500-d that supports dual mode ferroelectric memory cell operation in accordance with examples of the present disclosure. For example, hysteresis plot 500-a may be an example of a non-volatile sensing operation. After a command may be initiated to the memory cell while the memory cell operates in the non-volatile mode, a logic state stored in the memory cell may be sensed. As depicted in hysteresis plot 500-a, the ferroelectric material may maintain a positive polarization, resulting in two possible charged states (among other potential charged states): charge state 405-d and charge state 410-d. Charge states 405-d and 410-d may be examples of charge states 405 and 410, respectively, with reference to FIG. 4. According to the example of FIG. 4, charge state 405-d represents a logic 0 and charge state 410-d represents a logic 1.

In some examples, based on applying a net positive voltage 455-a across the capacitor, charge state 405-d follows path 440-a and results in charge accumulation until charge state 405-e is reached. For example, the first digit line may be biased to voltage 455-a (e.g., a first voltage) based on sensing logic 0. Upon removing voltage 455-a, charge state 405-e follows the reverse of path 440-a until it reaches charge state 405-d at zero voltage potential. Similarly, charge state 410-d is written by applying a net negative voltage (i.e., negative voltage 425 as depicted in FIG. 4A), which results in charge state 410-e. Charge state 410-d may be shifted along path 445-a to charge state 410-e due to charge sharing between the memory cell and the digit line.

In some cases, the final voltage may depend on the intrinsic capacitance of the digit line connected to the memory cell. For example, if the capacitor is electrically connected to the digit line and voltage 435-a is applied, the voltage of the digit line may rise due to its intrinsic capacitance. So a voltage measured at a sense component may not directly equal voltage 435-a and instead may depend on the voltage of the digit line. The position of final charge states 405-e and 410-e on hysteresis plot 500-a may thus depend on the capacitance of the digit line and may be determined through a load-line analysis—i.e., charge states 405-d and 410-d may be defined with respect to the digit line capacitance. As a result, the voltage of the capacitor, voltage 450-a or voltage 455-a, may be different and may depend on the initial state of the capacitor.

To read, or sense, the stored state of the ferroelectric capacitor, a voltage may be applied across the capacitor. Voltage 435-a may be a voltage which may depend on the capacitor in the circuitry. In response to voltage 435-a, charge state 405-d may follow path 440-a. Likewise, if charge state 410-d was initially stored, then it follows path 445-a. The final position of charge state 405-e and charge state 410-e depend on a number of factors, including the specific sensing scheme and circuitry. In some cases, the memory cell may be partially biased when operating in the non-volatile mode.

In some cases, a write-back operation may occur. For example, the initial logic value may be restored depending on the logic value determined during a read or sensing operation. In some examples, a write-back operation may occur automatically during a read operation when the memory cell operates in the volatile mode. In other examples, the memory cell charge state 405-d may follow path 440-a to charge state 405-e when operating in the non-volatile mode (e.g., when the digit line discharges to ground (0V)). In some examples, a negative bias (e.g., negative voltage 425 in reference to FIG. 4A) may be applied to the capacitor and charge state 410-a may follow path 430 to charge state 410 (e.g., when digit line discharges from negative voltage to ground or (0V)).

Figure 5A:
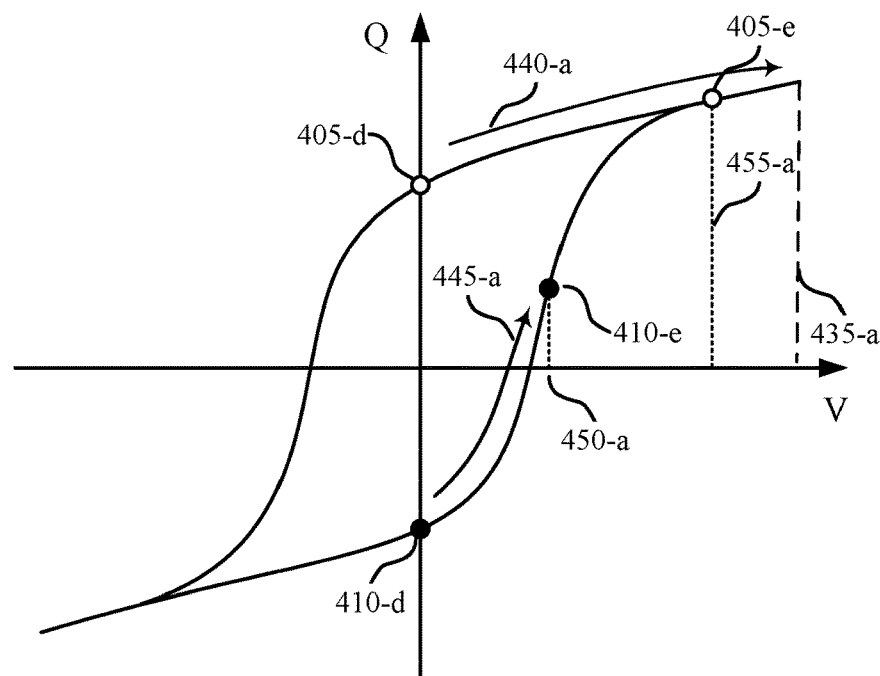
FIGS. 5A-5D illustrate example hysteresis plots for a memory cell that supports dual mode ferroelectric memory cell operation in accordance with examples of the present disclosure.
Figure 5B:
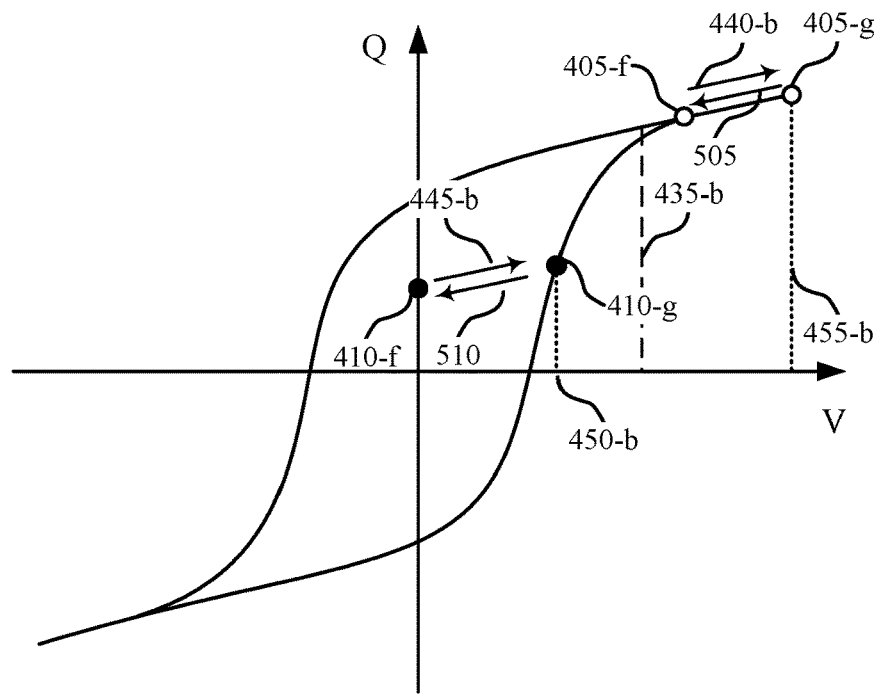

FIG. 5B illustrates an example of linear electrical properties with hysteresis plot 500-b for a ferroelectric memory cell that is operated in accordance with various embodiments of the present disclosure. For example, hysteresis plot 500-b may be an example of a volatile sensing operation. After a command may be initiated to the memory cell while the memory cell operates in the volatile mode, a logic state stored in the memory cell may be sensed. As depicted in hysteresis plot 500-b, the ferroelectric material may maintain a positive polarization, resulting in two possible charged states: charge state 405-f and charge state 410-f. According to the example of FIG. 4, charge state 405-f represents a logic 0 and charge state 410-f represents a logic 1.

In some examples, based on applying a net positive voltage 455-b across the capacitor, charge state 405-f follows path 440-b and results in charge accumulation until charge state 405-g is reached. For example, the first digit line may be biased to voltage 455-b (e.g., a first voltage) based on sensing logic 0. Upon removing voltage 455-b, charge state 405-g follows linear path 505 until it reaches charge state 405-f. In some cases, the cell may read a logic 0 at any state between charge state 405-f and charge state 405-g. Similarly, charge state 410-f is written by applying a net positive voltage 450-b, which results in charge state 410-g. For example, the first digit line may be biased to voltage 450-b (e.g., a second voltage) based on sensing logic 1. In response to voltage 450-b, charge state 405-f may follow path 445-b. After removing positive voltage 450-b, charge state 410-g follows linear path 510 until it reaches charge state 410-f at zero voltage. In some examples, reading a logic 1 in the volatile mode may be independent of the residual polarization charge on the capacitor. (e.g., the location of charge state 410-f on hysteresis plot 500-b). In some cases, voltage 455-b may be greater than voltage 450-b.

In some examples, if the cell stores a logic 0 at charge state 405-f, the digit line voltage may increase due to the cell providing some charge. In other examples, if the cell stores a logic 1 at charge state 410-f, the digit line voltage may decrease and result in a different voltage. In some cases, capacitors employed in volatile arrays may behave as a linear capacitor. For example, if charge state 410-f was initially stored, then it may follow path 445-b. To restore the stored logic value to the cell, the charge state 410-g may follow linear path 510.

In some cases, the final voltage may depend on the intrinsic capacitance of the digit line connected to the memory cell. For example, if the capacitor is positively charged and electrically connected to the digit line precharged at voltage 435-b, the voltage of the digit line may increase. In some examples, if the capacitor is negatively charged and electrically connected to the digit line precharged at voltage 435-b, the voltage of the digit line may decrease. So a voltage measured at a sense component may not equal voltage 435-b and instead may depend on the voltage of the digit line. The position of final charge states 405-g and 410-g on hysteresis plot 500-b may thus depend on the capacitance of the digit line and may be determined through a load-line analysis—i.e., charge states 405-g and 410-g may be defined with respect to the digit line capacitance. As a result, the voltage of the capacitor, voltage 450-b or voltage 455-b, may be different and may depend on the initial state of the capacitor.

Figure 5C:
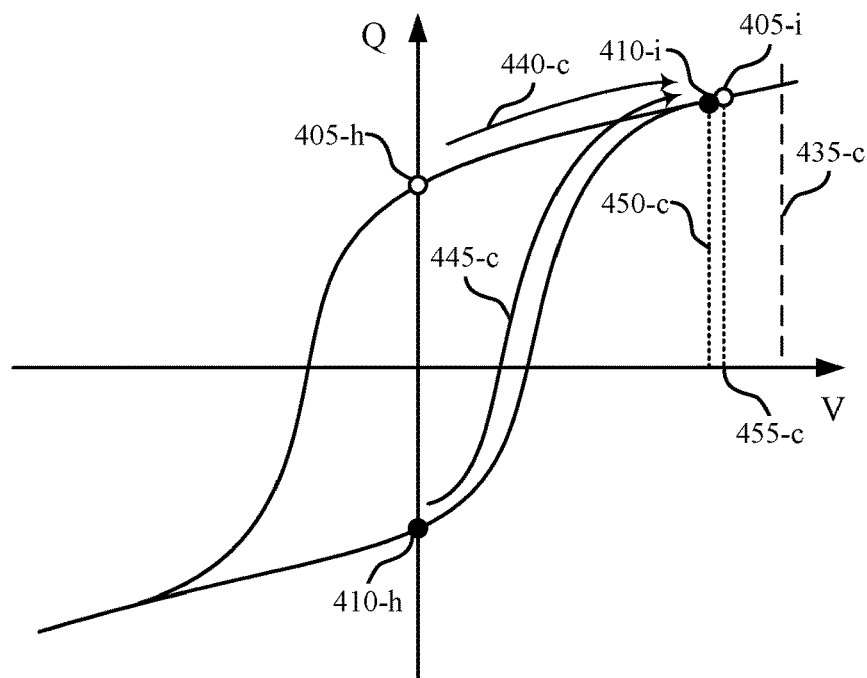

FIG. 5C illustrates an example of non-linear electrical properties with hysteresis plot 500-c for a ferroelectric memory cell that is operated in accordance with various embodiments of the present disclosure. For example, hysteresis plot 500-c may be an example of a non-volatile sensing operation. After a command may be initiated to the memory cell while the memory cell operates in the non-volatile mode, a logic state stored in the memory cell may be sensed. As depicted in hysteresis plot 500-c, the ferroelectric material may maintain a positive polarization, resulting in two possible charged states: charge state 405-h and charge state 410-h. According to the example of FIG. 4, charge state 405-h represents a logic 0 and charge state 410-h represents a logic 1.

In some examples, based on applying a net positive voltage 455-c across the capacitor, charge state 405-h follows path 440-c and results in charge accumulation until charge state 405-c is reached. For example, the first digit line may be biased to voltage 455-c (e.g., a first voltage) based on sensing logic 0. Upon removing voltage 455-c, charge state 405-i follows the reverse of path 440-c until it reaches charge state 405-h at zero voltage potential. Similarly, charge state 410-i is written by applying a net positive voltage 450-c, which results in charge state 410-i. For example, the first digit line may be biased to voltage 450-c (e.g., a second voltage) based on sensing logic 1. In response to voltage 450-c, charge state 410-h may follow path 445-c to charge state 410-i. Charge state 410-i may follow the reverse of path 440-c until it reaches charge state 405-h at zero voltage to reprogram the data.

In some cases, the final voltage may depend on the intrinsic capacitance of the digit line connected to the memory cell. For example, if the capacitor is electrically connected to the digit line and voltage 435-c is applied, the voltage of the digit line may rise due to its intrinsic capacitance. So a voltage measured at a sense component may not equal voltage 435-c and instead may depend on the voltage of the digit line. The position of final charge states 405-i and 410-i on hysteresis plot 500-c may thus depend on the capacitance of the digit line and may be determined through a load-line analysis—i.e., charge states 405-i and 410-i may be defined with respect to the digit line capacitance. As a result, the voltage of the capacitor, voltage 450-c or voltage 455-c, may be different and may depend on the initial state of the capacitor.

To read, or sense, the stored state of the ferroelectric capacitor, a voltage may be applied across the capacitor. Voltage 435-c may be a voltage which may depend on the capacitor in the circuitry. In response to voltage 435-c, charge state 405-h may follow path 440-c. Likewise, if charge state 410-h was initially stored, then it follows path 445-c. The final position of charge state 405-h and charge state 410-h depend on a number of factors, including the specific sensing scheme and circuitry. For example, the circuitry of FIG. 5C may include a differential amplifier that may aim to keep a constant voltage on the input. In some cases, the memory cell may be fully biased when operating in the non-volatile mode.

Figure 5D:
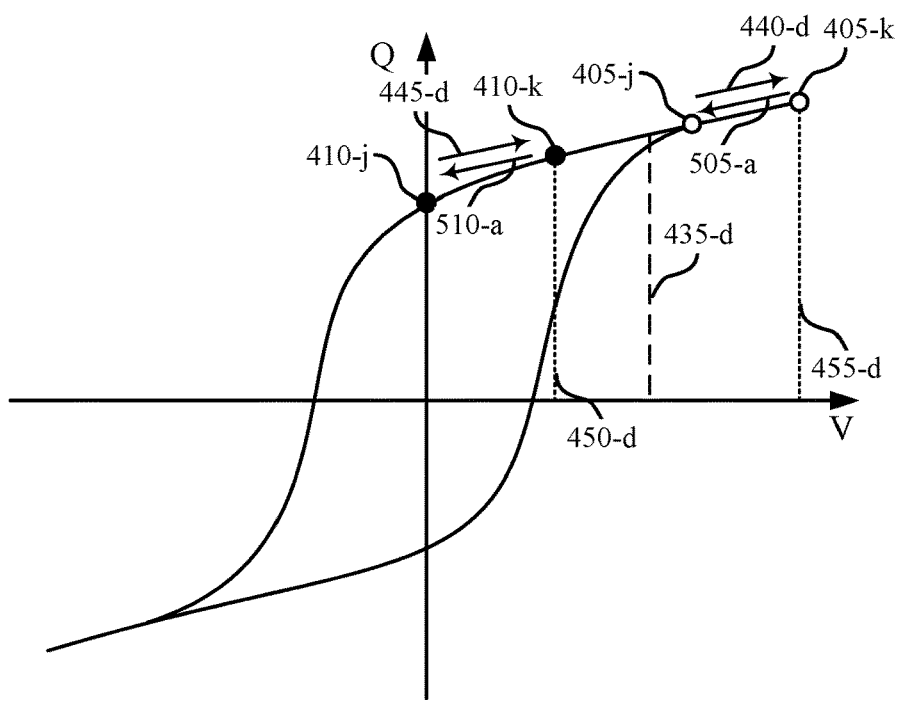

FIG. 5D illustrates an example of linear electrical properties with hysteresis plot 500-d for a ferroelectric memory cell that is operated in accordance with various embodiments of the present disclosure. For example, hysteresis plot 500-d may be an example of a volatile sensing operation. After a command may be initiated to the memory cell while the memory cell operates in the volatile mode, a logic state stored in the memory cell may be sensed. As depicted in hysteresis plot 500-d, the ferroelectric material may maintain a positive polarization, resulting in two possible charged states: charge state 405-j and charge state 410-j. According to the example of FIG. 4, charge state 405-j represents a logic 0 and charge state 410-j represents a logic 1. In some cases, the cell may read a logic 0 at any state between charge state 405-j and charge state 405-k.

In some examples, based on applying a net positive voltage 455-d across the capacitor, charge state 405-j follows path 440-d and results in charge accumulation until charge state 405-k is reached. For example, the first digit line may be biased to voltage 455-d (e.g., a first voltage) based on sensing logic 0. Charge state 405-k may follow linear path 505-a until it reaches charge state 405-j due to current leakage on the capacitor. In some cases, the cell may be refreshed before charge state 405-j is below the minimum charge state readable as a logic 0 (e.g., less than voltage 435-d). In some cases, charge state 410-j is written when the digit line discharges to ground (0V)). For example, the first digit line may be biased to voltage 450-d (e.g., a second voltage) based on sensing logic 1. In response to voltage 450-d, charge state 410-j may follow path 445-d. After removing positive voltage 450-d, charge state 410-c follows linear path 510-a until it reaches charge state 410-j at zero voltage. In some cases, voltage 455-d may be greater than voltage 450-d.

In some examples, if the cell stores a logic 0 at charge state 405-j, the digit line voltage may increase due to the cell providing some charge. In other examples, if the cell stores a logic 1 at charge state 410-*j*, the digit line voltage may decrease and result in a different voltage. In some cases, capacitors employed in volatile arrays may behave as a linear capacitor. For example, if charge state 410-*j* was initially stored, then it may follow path 445-*d*. To restore the stored logic value to the cell, the charge state 410-*k* may follow linear path 510-*a*.

In some cases, the final voltage may depend on the intrinsic capacitance of the digit line connected to the memory cell. For example, if the digit line may be pre-charged to voltage 435-*d*, the word line may be activated to electrically connect the capacitor to the digit line. In some cases, the voltage of the digit line may increase to charge state 405-*j* if the capacitor is charged. In other examples the voltage of the digit line may decrease to charge state 410-*k* if the capacitor has no charge. So a voltage measured at a sense component may not equal voltage 435-*d* and instead may depend on the voltage of the digit line. The position of final charge states 405-*k* and 410-*k* on hysteresis plot 500-*d* may thus depend on the capacitance of the digit line and may be determined through a load-line analysis—i.e., charge states 405-*k* and 410-*k* may be defined with respect to the digit line capacitance. As a result, the voltage of the capacitor, voltage 450-*d* or voltage 455-*d*, may be different and may depend on the initial state of the capacitor. In some examples, the circuitry of FIG. 5D may include a differential amplifier that may aim to keep a constant voltage on the input.

FIG. 6A-6B illustrates example voltage plots 600-*a* and 600-*b* for a memory cell that that supports dual mode ferroelectric memory cell operation in accordance with examples of the present disclosure. Voltage plots 600-*a* and 600-*b* illustrate an example ferroelectric memory cell sensing and pre-charging process, respectively. Voltage plots 600-*a* and 600-*b* depict the voltage, V, of the word line (e.g., word line 110 of FIG. 1) as a function of time, t. For example, voltage plot 600-*a* may include plate line voltage 625 and reference voltage 630. Voltage plot 600-*b* may include first voltage 635 and second voltage 640.

As described herein, voltage plot 600-*a* illustrates examples of non-volatile region 605, transition region 610, volatile region 615, transition region 620, and non-volatile region 605-*a*. Non-volatile regions 605 and 605-*a* may represent a period when one or more memory cells of the memory array may operate in the non-volatile mode while volatile region 615 may represent a period when one or more memory cells of the memory may operate in the volatile mode. In some cases, transition region 610 may represent a period when one or more memory cells of the memory array switch between a non-volatile mode of operation and a volatile mode of operation. In other examples, transition region 620 may represent a period when one or more memory cells of the memory array may switch between a volatile mode of operation and a non-volatile mode of operation. In some cases, during transition region 610, a read operation may occur in the non-volatile mode and then a write operation may occur in the volatile mode. In some examples, during transition region 620, a read operation may occur in the volatile mode and then a write operation may occur in the non-volatile mode.

Voltage plot 600-*a* also illustrates examples of plate line voltage 625 and reference voltage 630. In some examples, the plate line voltage 625 may increase during transition region 610 and remain at higher voltage during volatile region 615 when compared to non-volatile region 605. For example, the plate line voltage 625 may remain at a high voltage (e.g., approximately 1.6 V) during a sensing operation (e.g., a write operation) when the memory cell operates in the volatile mode. After the second command may be issued, the memory cell may switch from a volatile mode of operation to a non-volatile mode of operation during transition region 620 and the plate line voltage 625 may decrease to plate line voltage 625 (e.g., 0 V) in non-volatile region 605-*a*.

As depicted in voltage plot 600-*a*, a reference voltage 630 may be used to read the memory cell operating in the non-volatile mode as seen in non-volatile region 605 and a different reference voltage 630 may be used to read the memory cell operating in the volatile mode as seen in volatile region 615. The memory cell may be pre-charged during transition region 610 using a different reference voltage 630 when the memory cell may operate in the volatile mode as compared to when memory cell may operate in the non-volatile mode. In some examples, the memory cell may perform one or more sensing operations and one or more pre-charge operations, which may in some cases occur multiple times or in a repeated fashion. For example, the sensing and pre-charge operations may occur in volatile region 615. For example, a sensing operation may be performed at times t1, t3, t5, t7, and t9 (as one set of examples) in volatile region 615. In some cases, a pre-charge operation may occur after the sensing operation and may be performed at times t2, t4, t6, and t8 (as one set of examples) in volatile region 615. In some cases, a write operation may occur in volatile region 615 at one or more times t1, t3, t5, t7, and t9.

In some examples, the reference voltage 630 may be lower in non-volatile region 605 than in volatile region 615. For example, the reference voltage 630 may increase in transition region 610 to reference voltage 630 in volatile region 615. In other examples, the reference voltage 630 may be lower in non-volatile region 605-*a* when compared to volatile region 615. For example, the reference voltage 630 may decrease in transition region 620 to reference voltage 630 in non-volatile region 605-*a*.

As described herein, voltage plot 600-*b* illustrates examples of non-volatile region 605-*b*, transition region 610-*a*, volatile region 615-*a*, transition region 620-*a*, and non-volatile region 605-*c*. Non-volatile regions 605-*b* and 605-*c* may represent a period when one or more memory cells of the memory array may operate in the non-volatile mode while volatile region 615-*a* may represent a period when one or more memory cells of the memory may operate in the volatile mode. In some cases, transition region 610-*a* may represent a period when one or more memory cells of the memory array may switch between a non-volatile mode of operation and a volatile mode of operation. In other examples, transition region 620-*a* may represent a period when one or more memory cells of the memory array may switch between a volatile mode of operation and a non-volatile mode of operation.

In some examples, the memory cell may perform one or more sensing operations and one or more pre-charge operations, which may in some cases occur multiple times or in a repeated fashion. For example, the sensing and pre-charge operations may occur in volatile region 615. For example, a sensing operation may be performed at times t1, t3, t5, t7, and t9 (as one set of examples) in volatile region 615-*a*. In some cases, a pre-charge operation may occur after the sensing operation and may be performed at times t2, t4, t6, and t8 (as one set of examples) in volatile region 615-*a*. In some cases, a write operation may occur in volatile region 615-*a* at one or more times t1, t3, t5, t7, and t9.

Voltage plot 600-b may also comprise first voltage 635 and a second voltage 640. In some examples, first voltage 635 and second voltage 640 may be an example of the internal capacitor node voltage (e.g., the voltage of cell bottom 215 of FIG. 2) In some examples, a digit line may be biased to first voltage 635 based on sensing logic 0. In other examples, a digit line may be biased to a second voltage 640 based on sensing logic 1. For example, after a first command may be initiated to the memory cell during non-volatile region 605-b and 605-c, a logic state stored in the memory cell may also be sensed. In some cases, after a second command may be initiated to the memory cell during volatile region 615-a, a logic state stored in the memory cell may also be sensed.

In some examples, the first voltage 635 may be lower in non-volatile region 605-b when compared to volatile region 615-a. For example, the first voltage 635 may increase in transition region 610-a to first voltage 635 in volatile region 615-a. In other examples, the first voltage 635 may be lower in non-volatile region 605-c when compared to volatile region 615-a. For example, the first voltage 635 may decrease in transition region 620-a to first voltage 635 in non-volatile region 605-c.

In some examples, the second voltage 640 may be lower in volatile region 615-a when compared to non-volatile region 605-b. For example, the second voltage 640 may decrease in transition region 610-a to second voltage 640 in volatile region 615-a. In other examples, the second voltage 640 may be lower in non-volatile region 605-c when compared to volatile region 615-a. For example, the second voltage 640 may decrease in transition region 620-a to second voltage 640 in non-volatile region 605-c. In some cases, the digit line may be pre-charged at times t2, t4, t6, and t8 during volatile region 615-a.

In some examples, first voltage 635 may decrease at times t1, t3, t5, t7, and t9 from a voltage that may correspond to charge state 405-k to a voltage that may correspond to charge state 405-j as depicted in FIG. 5D. In some examples, second voltage 640 may increase at times t1, t3, t5, t7, and t9 from a voltage that may correspond to charge state 410-j to a voltage that may correspond to charge state 410-k as depicted in FIG. 5D. For example, the digit line voltage (i.e. voltage 435-d as depicted in FIG. 5D) may be at a common pre-charge voltage (not shown) between the peaks of first voltage 635 and second voltage 640 during volatile region 615-a.

Figure 7:
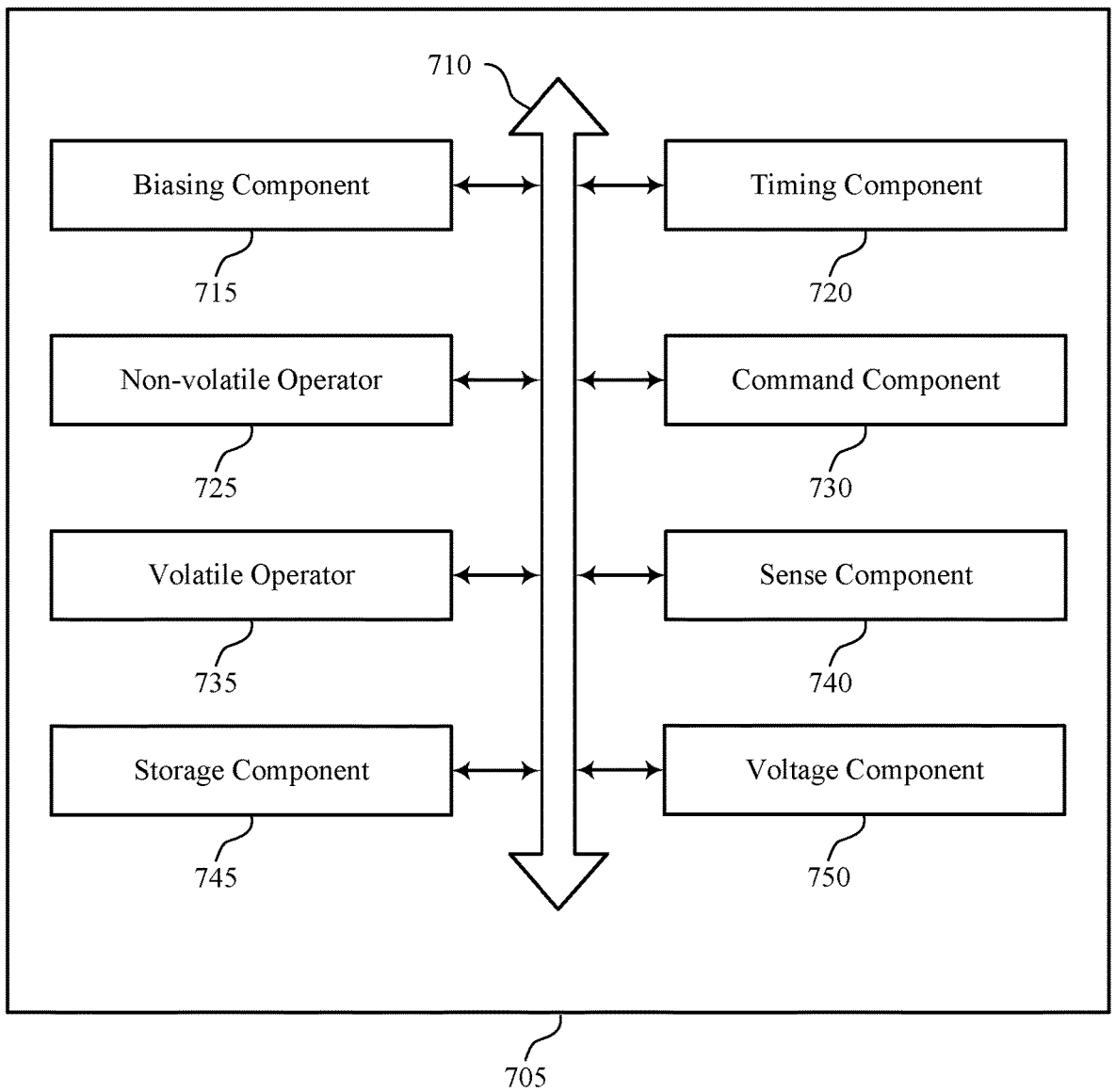
FIGS. 7 through 8 show block diagrams of a device that supports dual mode ferroelectric memory cell operation in accordance with examples of the present disclosure.

FIG. 7 shows a block diagram 700 of a memory controller 705 that supports dual mode ferroelectric memory cell operation in accordance with various examples of the present disclosure. The memory controller 705 may include biasing component 715, timing component 720, non-volatile operator 725, command component 730, volatile operator 735, sense component 740, storage component 745, and voltage component 750. Each of these modules may communicate, directly or indirectly, with one another via one or more buses. (e.g., bus 710).

Biasing component 715 may bias a first digit line of the first ferroelectric memory cell to a first voltage based on sensing the logic state. In some cases, biasing component 715 may bias the first digit line of the first ferroelectric memory cell to a second voltage different than the first voltage based on sensing the logic state. In some cases, the first voltage is greater than the second voltage.

Timing component 720 may be in electronic communication with the sense component. In some cases, timing component 720 may provide a timing signal associated with the non-volatile operation mode or the volatile operation mode to the sense component at a first time.

Non-volatile operator 725 may operate a ferroelectric memory cell of a memory array in a non-volatile mode based on the second command and operate a second ferroelectric memory cell of the memory array in the non-volatile mode while operating the ferroelectric memory cell in the volatile mode. In some cases, non-volatile operator 725 may operate the ferroelectric memory cell in the non-volatile mode after the storing based at least in part initiating the second command and operate the first ferroelectric memory cell in a non-volatile mode based on storing the logic state.

Command component 730 may initiate a first command while operating the ferroelectric memory cell in the non-volatile mode, initiate a second command while operating the ferroelectric memory cell in the volatile mode, and initiate a refresh command to the first portion of the memory array based on determining the operation mode.

Volatile operator 735 may operate the ferroelectric memory cell in a volatile mode based at least in part on the first command and operate a second ferroelectric memory cell of the memory array in the volatile mode while operating the ferroelectric memory cell in the volatile mode. Volatile operator 735 may operate the ferroelectric memory cell in a volatile mode after the storing and operate the first ferroelectric memory cell in a volatile mode based at least in part on storing the logic state.

Sense component 740 may sense a first logic state of the ferroelectric memory cell based at least in part on the first command, sense a second logic state of the ferroelectric memory cell based at least in part on the second command, sense a logic state stored in the first ferroelectric memory cell based at least in part on the command, and may be in electronic communication with the first ferroelectric memory cell.

Storage component 745 may store the sensed first logic state in a storage component associated with the ferroelectric memory cell and store the logic state in a sense component of the memory array based on the sensing.

Voltage component 750 may apply a first reference voltage to the ferroelectric memory cell based at least in part on a first portion of the memory array operating in the non-volatile mode. In some cases, voltage component 750 may pre-charge a digit line associated with the ferroelectric memory cell at the first reference voltage based at least in part on operating the ferroelectric memory cell in the volatile mode. In other examples, voltage component 750 may apply a second reference voltage different from the first reference voltage of the ferroelectric memory cell based at least in part on the first portion of the memory array operating in the volatile mode. The voltage component 750 may be in electronic communication with the sense component and provide a reference voltage associated with the non-volatile operation mode or the volatile operation mode to the sense component at a first time.

Figure 8:
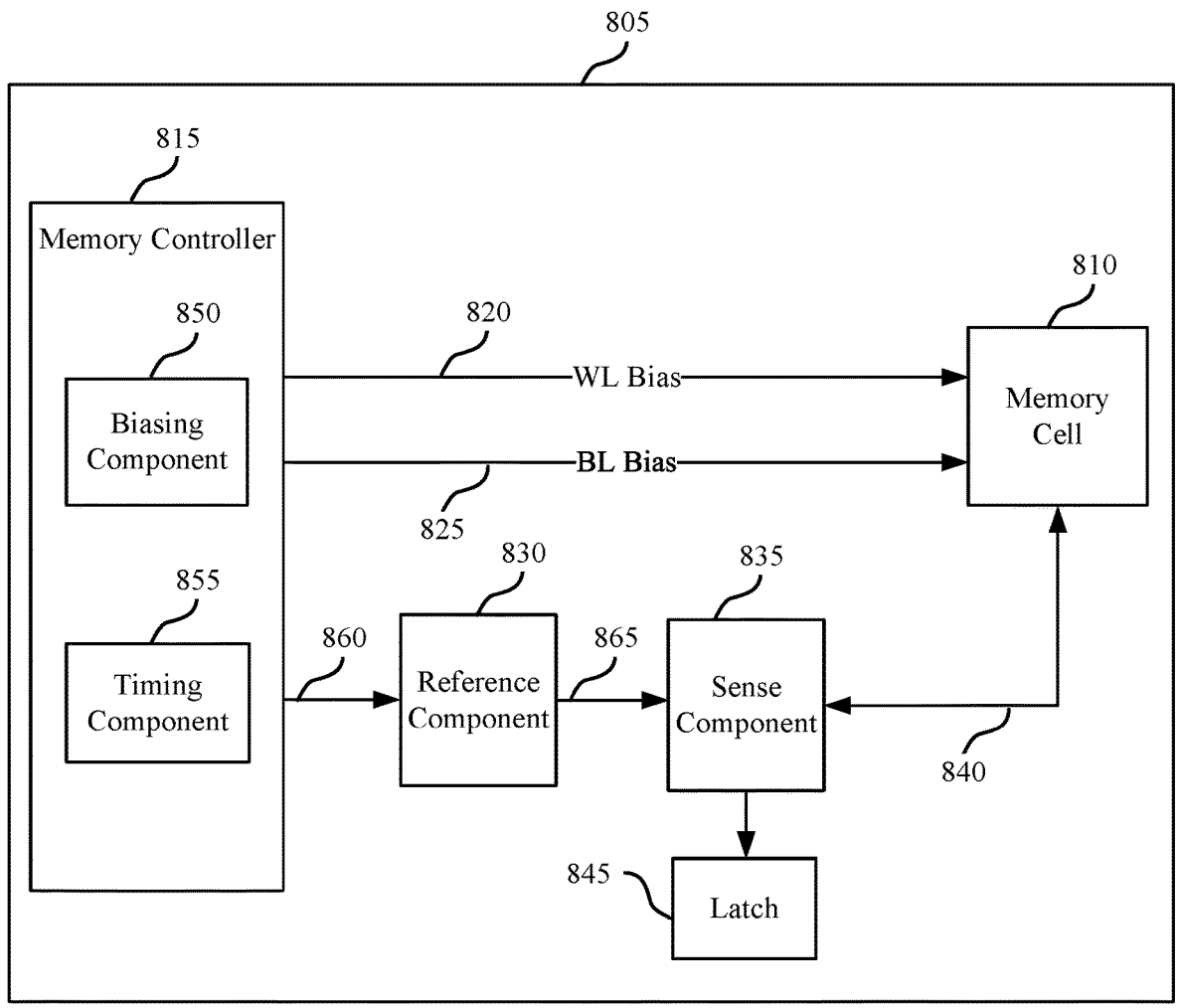

FIG. 8 shows a block diagram 800 of a memory array 805 that supports dual mode ferroelectric memory cell operation in accordance with various examples of the present disclosure. Memory array 805 may be referred to as an electronic memory apparatus, and may be an example of a component of a memory array 100 as described with reference to FIG. 1.

Memory array 805 may include one or more ferroelectric memory cells 810, a memory controller 815, a word line 820, a bit line 825, a reference component 830, a sense component 835, a digit line 840, and a latch 845. These components may be in electronic communication with each other and may perform one or more of the functions described herein. In some cases, memory controller 815 may include biasing component 850 and timing component 855.

Memory controller 815 may be in electronic communication with word line 820, digit line 840, sense component 835, and bit line 825, which may be examples of word line 110, digit line 115, sense component 125, and plate line 210 described with reference to FIGS. 1, and 2. Memory array 805 may also include reference component 830 and latch 845. The components of memory array 805 may be in electronic communication with each other and may perform examples of the functions described with reference to FIGS. 1 through 7. In some cases, reference component 830, sense component 835, and latch 845 may be components of memory controller 815.

In some examples, digit line 840 is in electronic communication with sense component 835 and a ferroelectric capacitor of ferroelectric memory cells 810. A ferroelectric memory cell 810 may be writable with a logic state (e.g., a first or second logic state). Word line 820 may be in electronic communication with memory controller 815 and a selection component of ferroelectric memory cell 810. Bit line 825 may be in electronic communication with memory controller 815 and a plate of the ferroelectric capacitor of ferroelectric memory cell 810. Sense component 835 may be in electronic communication with memory controller 815, digit line 840, latch 845, and reference line 860. Reference component 830 may be in electronic communication with memory controller 815 and reference line 860. Sense control line 865 may be in electronic communication with sense component 835 and memory controller 815. These components may also be in electronic communication with other components, both inside and outside of memory array 805, in addition to components not listed above, via other components, connections, or busses.

Memory controller 815 may be configured to activate word line 820, bit line 825, and/or digit line 840 by applying voltages to those various nodes. For example, biasing component 850 may be configured to apply a voltage to operate ferroelectric memory cell 810 to read or write ferroelectric memory cell 810 as described above. In some cases, memory controller 815 may include a row decoder, column decoder, or both, as described with reference to FIG. 1. This may enable memory controller 815 to access one or more memory cells 810. Biasing component 850 may also provide voltage potentials to reference component 830 in order to generate a reference signal for sense component 835. Additionally, biasing component 850 may provide voltage potentials for the operation of sense component 835.

In some cases, memory controller 815 may perform its operations using timing component 855. For example, timing component 855 may control the timing of the various word line selections or plate biasing, including timing for switching and voltage application to perform the memory functions, such as reading and writing, discussed herein. In some cases, timing component 855 may control the operations of biasing component 850.

Reference component 830 may include various components to generate a reference signal for sense component 835. Reference component 830 may include circuitry configured to produce a reference signal. In some cases, reference component 830 may be implemented using other ferroelectric memory cells 810. Sense component 835 may compare a signal from ferroelectric memory cell 810 (through digit line 840) with a reference signal from reference component 830. Upon determining the logic state, the sense component may then store the output in latch 845, where it may be used in accordance with the operations of an electronic device that memory array 805 is a part. Sense component 835 may include a sense amplifier in electronic communication with the latch and the ferroelectric memory cell.

Memory controller 815 and/or at least some of its various sub-components may be implemented in hardware, software executed by a processor, firmware, or any combination thereof. If implemented in software executed by a processor, the functions of the memory controller 815 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 815 and/or at least some of its various sub-components may be physically located at various positions, including being distributed such that portions of functions are implemented at different physical locations by one or more physical devices. In some examples, memory controller 815 and/or at least some of its various sub-components may be a separate and distinct component in accordance with various examples of the present disclosure. In other examples, memory controller 815 and/or at least some of its various sub-components may be combined with one or more other hardware components, including but not limited to an I/O component, a transceiver, a network server, another computing device, one or more other components described in the present disclosure, or a combination thereof in accordance with various examples of the present disclosure.

Memory controller 815 may operate a ferroelectric memory cell of a memory array in a non-volatile mode, initiate a first command while operating the ferroelectric memory cell in the non-volatile mode, and operate the ferroelectric memory cell in a volatile mode based on the first command. The memory controller 815 may also initiate a first command while operating a ferroelectric memory cell of a memory array in a non-volatile mode, sense a first logic state of the ferroelectric memory cell based on the first command, store the sensed first logic state in a storage component associated with the ferroelectric memory cell, and operate the ferroelectric memory cell in a volatile mode after the storing. The memory controller 815 may also sense a logic state stored in the first ferroelectric memory cell based on the command, store the logic state in a sense component of the memory array based on the sensing, and operate the first ferroelectric memory cell in a volatile mode based on storing the logic state. The memory controller 815 may also sense a logic state stored in the first ferroelectric memory cell based on the command, store the logic state in a sense component of the memory array based on the sensing, and operate the first ferroelectric memory cell in a non-volatile mode based on storing the logic state. In some cases, a first ferroelectric memory cell may be in a first portion of a memory array. In some cases, a transistor may be coupled to the first ferroelectric memory cell. In some cases, a controller may be in electronic communication with the transistor and a sensing component, where the controller is configured to initiate a command to the first ferroelectric memory cell while the first ferroelectric memory cell is in a non-volatile mode. In some cases, a first ferroelectric memory cell may be in a first portion of a memory array. In some cases, a transistor may be coupled to the first ferroelectric memory cell. In some cases, a controller may be in electronic communication with the transistor and a sensing component, where the controller is configured to initiate a command to the first ferroelectric memory cell while the first ferroelectric memory cell is in a volatile mode.

Figure 9:
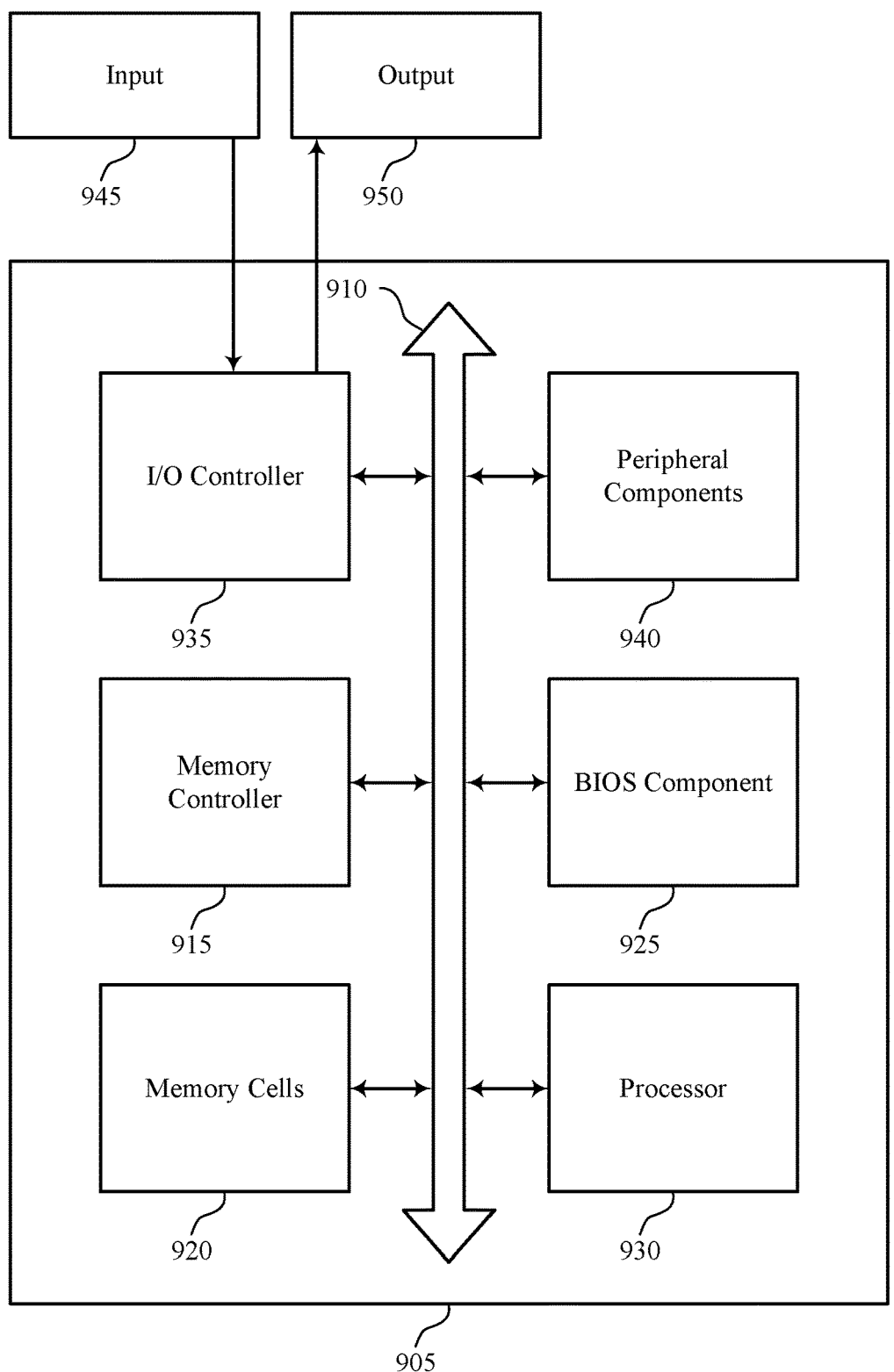
FIG. 9 illustrates a block diagram of a system including a memory array that supports dual mode ferroelectric memory cell operation in accordance with examples of the present disclosure.

FIG. 9 shows a diagram of a system 900 including a device 905 that supports dual mode ferroelectric memory cell operation in accordance with various examples of the present disclosure. Device 905 may be an example of or include the components of memory array 100 as described above, e.g., with reference to FIG. 1. Device 905 may include components for bi-directional voice and data communications including components for transmitting and receiving communications, including memory controller 915, memory cells 920, basic input/output system (BIOS) component 925, processor 930, I/O controller 935, and peripheral components 940. These components may be in electronic communication via one or more busses (e.g., bus 910).

Memory controller 915 may operate one or more memory cells as described herein. Specifically, memory controller 915 may be configured to support dual mode ferroelectric memory cell operation. In some cases, memory controller 915 may include a row decoder, column decoder, or both, as described with reference to FIG. 1 (not shown).

Memory cells 920 may store information (i.e., in the form of a logical state) as described herein.

BIOS component 925 be a software component that includes BIOS operated as firmware, which may initialize and run various hardware components. BIOS component 925 may also manage data flow between a processor and various other components, e.g., peripheral components, input/output control component. BIOS component 925 may include a program or software stored in read only memory (ROM), flash memory, or any other non-volatile memory.

Processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 930 may be configured to operate a memory array using a memory controller. In other cases, a memory controller may be integrated into processor 930. Processor 930 may be configured to execute computer-readable instructions stored in a memory to perform various functions (e.g., functions or tasks supporting dual mode ferroelectric memory cell operation).

I/O controller 935 may manage input and output signals for device 905. I/O controller 935 may also manage peripherals not integrated into device 905. In some cases, I/O controller 935 may represent a physical connection or port to an external peripheral. In some cases, I/O controller 935 may utilize an operating system such as iOS®, ANDROID®, MS-DOS®, MS-WINDOWS®, OS/2®, UNIX®, LINUX®, or another known operating system. In other cases, I/O controller 935 may represent or interact with a modem, a keyboard, a mouse, a touchscreen, or a similar device. In some cases, I/O controller 935 may be implemented as part of a processor. In some cases, a user may interact with device 905 via I/O controller 935 or via hardware components controlled by I/O controller 935.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or interface with or between other devices. In some cases, input 945 may be a peripheral that interfaces with device 905 via peripheral component(s) 940 or may be managed by input/output control component 935.

Output 950 may represent a device or signal external to device 905 configured to receive output from device 905 or any of its components. Examples of output 950 may include a display, audio speakers, a printing device, another processor or printed circuit board, etc. In some cases, output 950 may be a peripheral that interfaces with device 905 via peripheral component(s) 940 or may be managed by input/output control component 935. In some cases, a battery-powered system may be switched off and automatically store data in the non-volatile mode. In some examples, a battery-powered system may be switched on and automatically store data in the volatile mode.

Figure 10:
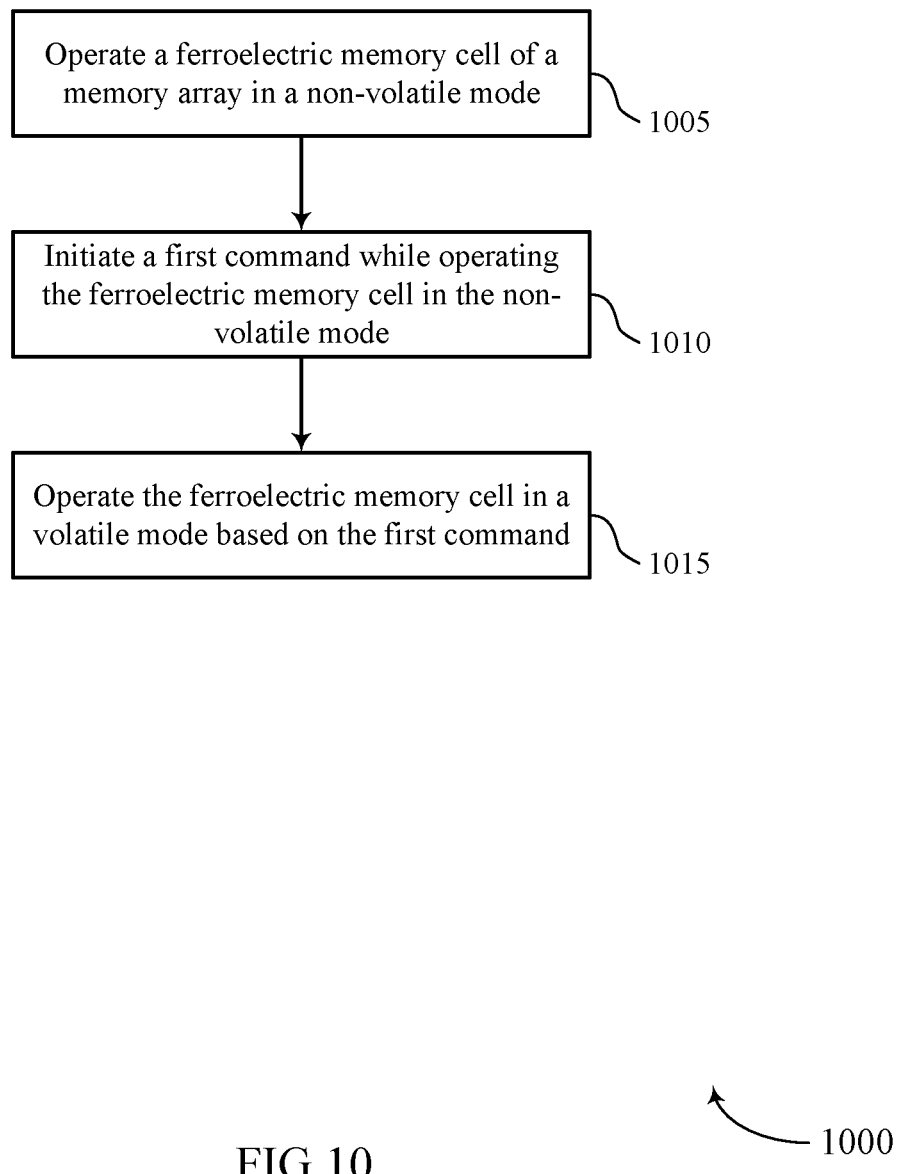
FIGS. 10 through 13 illustrate methods for dual mode ferroelectric memory cell operation in accordance with examples of the present disclosure.

FIG. 10 shows a flowchart illustrating a method 1000 for dual mode ferroelectric memory cell operation in accordance with various examples of the present disclosure. The operations of method 1000 may be implemented by a memory array 100 or its components as described herein. For example, the operations of method 1000 may be performed by a memory controller as described with reference to FIGS. 7 through 9. In some examples, a memory array 100 may execute a set of codes to control the functional elements of the device to perform the functions described below. Additionally or alternatively, the memory array 100 may perform examples of the functions described below using special-purpose hardware.

At block 1005 the memory array 100 may operate a ferroelectric memory cell of a memory array in a non-volatile mode. The operations of block 1005 may be performed according to the methods described with reference to FIGS. 2 through 5. The method 1000 may further include writing data in a non-volatile mode, reading data in a non-volatile mode, and refreshing data in a non-volatile mode, among other operations in a non-volatile mode. In certain examples, examples of the operations of block 1005 may be performed by a non-volatile operator as described with reference to FIGS. 7 through 9.

At block 1010 the memory array 100 may initiate a first command while operating the ferroelectric memory cell in the non-volatile mode. The operations of block 1010 may be performed according to the methods described with reference to FIGS. 2 through 5. In some examples, initiating the first command includes selecting a first portion of the memory array comprising the memory cell. In some examples, method 1000 may further include reading data in a non-volatile mode and writing data in a volatile mode. In certain examples, examples of the operations of block 1010 may be performed by a command component as described with reference to FIGS. 7 through 9.

At block 1015 the memory array 100 may operate the ferroelectric memory cell in a volatile mode based at least in part on the first command. The operations of block 1015 may be performed according to the methods described with reference to FIGS. 2 through 5. The method 1000 may further include writing data in a volatile mode, reading data in a volatile mode, and refreshing data in a volatile mode, among other operations in a non-volatile mode. In some examples, operating the memory cell in a volatile mode may include operating a second memory cell in a second portion of the memory array different from operating the first memory cell in the first portion of the memory array in the non-volatile mode. In certain examples, examples of the operations of block 1015 may be performed by a volatile operator as described with reference to FIGS. 7 through 9.

Figure 11:
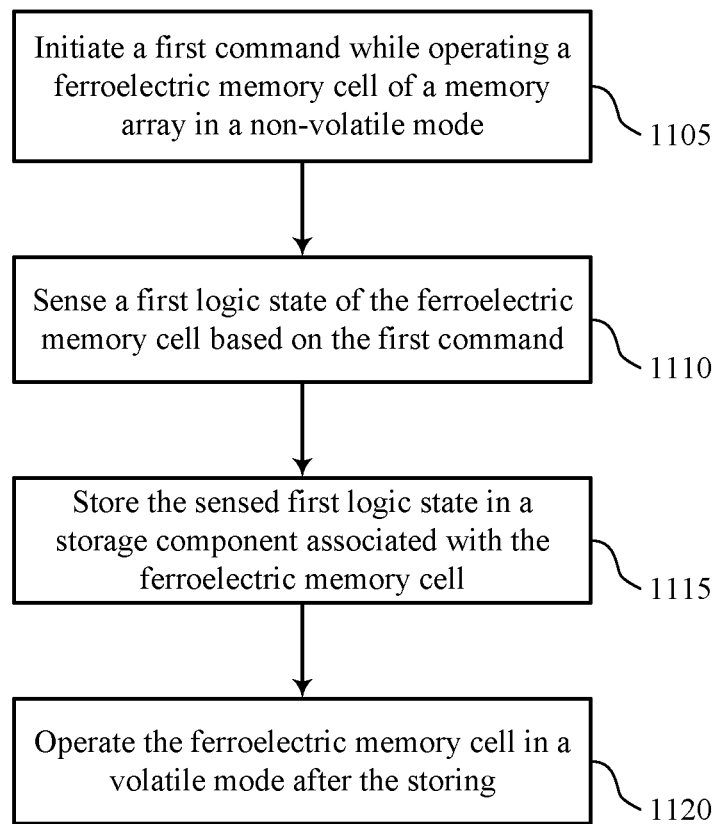

FIG. 11 shows a flowchart illustrating a method 1100 for dual mode ferroelectric memory cell operation in accordance with various examples of the present disclosure. The operations of method 1100 may be implemented by a memory array 100 or its components as described herein. For example, the operations of method 1100 may be performed by a memory controller as described with reference to FIGS. 7 through 9. In some examples, a memory array 100 may execute a set of codes to control the functional elements of the device to perform the functions described below. Additionally or alternatively, the memory array 100 may perform examples of the functions described below using special-purpose hardware.

At block 1105 the memory array 100 may initiate a first command while operating a ferroelectric memory cell of a memory array in a non-volatile mode. The operations of block 1105 may be performed according to the methods described with reference to FIGS. 2 through 5. In certain examples, examples of the operations of block 1105 may be performed by a command component as described with reference to FIGS. 7 through 9.

At block 1110 the memory array 100 may sense a first logic state of the ferroelectric memory cell based at least in part on the first command. The operations of block 1110 may be performed according to the methods described with reference to FIGS. 2 through 5. In certain examples, examples of the operations of block 1110 may be performed by a sense component as described with reference to FIGS. 7 through 9.

At block 1115 the memory array 100 may store the sensed first logic state in a storage component associated with the ferroelectric memory cell. The operations of block 1115 may be performed according to the methods described with reference to FIGS. 2 through 5. In certain examples, examples of the operations of block 1115 may be performed by a storage component as described with reference to FIGS. 6 through 9.

At block 1120 the memory array 100 may operate the ferroelectric memory cell in a volatile mode after the storing. The operations of block 1120 may be performed according to the methods described with reference to FIGS. 2 through 5. In certain examples, examples of the operations of block 1120 may be performed by a volatile operator as described with reference to FIGS. 7 through 9.

Figure 12:
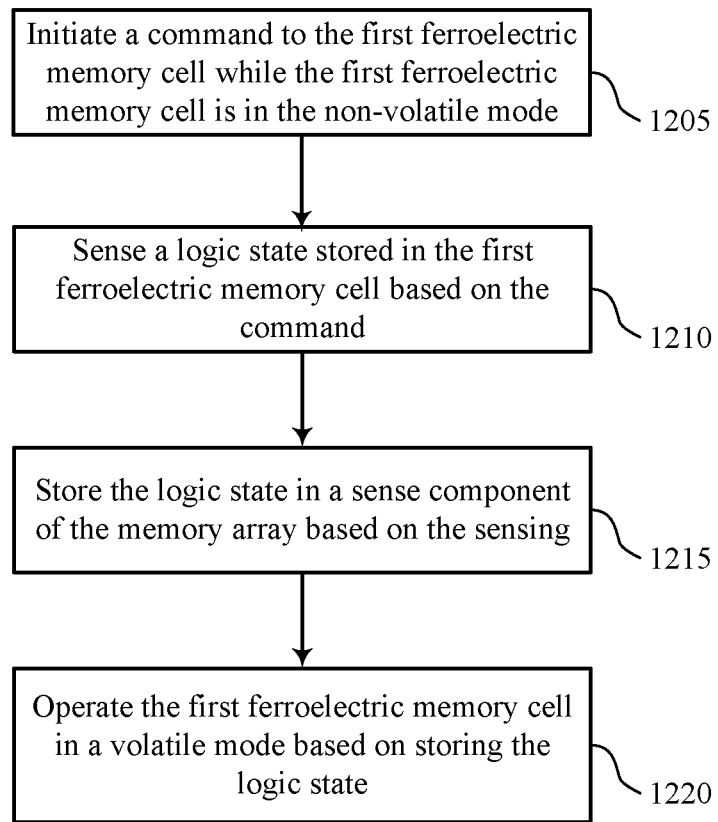

FIG. 12 shows a flowchart illustrating a method 1200 for dual mode ferroelectric memory cell operation in accordance with various examples of the present disclosure. The operations of method 1200 may be implemented by a memory array 100 or its components as described herein. For example, the operations of method 1200 may be performed by a memory controller as described with reference to FIGS. 7 through 9. In some examples, a memory array 100 may execute a set of codes to control the functional elements of the device to perform the functions described below. Additionally or alternatively, the memory array 100 may perform examples of the functions described below using special-purpose hardware.

At block 1205 the memory array 100 may initiate a command to the first ferroelectric memory cell while the first ferroelectric memory cell is in the non-volatile mode.

The operations of block 1205 may be performed according to the methods described with reference to FIGS. 2 through 5. In certain examples, examples of the operations of block 1205 may be performed by a command component as described with reference to FIGS. 7 through 9.

At block 1210 the memory array 100 may sense a logic state stored in the first ferroelectric memory cell based at least in part on the command. The operations of block 1210 may be performed according to the methods described with reference to FIGS. 2 through 5. In certain examples, examples of the operations of block 1210 may be performed by a sense component as described with reference to FIGS. 7 through 9.

At block 1215 the memory array 100 may store the logic state in a sense component of the memory array based at least in part on the sensing. The operations of block 1215 may be performed according to the methods described with reference to FIGS. 2 through 5. In certain examples, examples of the operations of block 1215 may be performed by a storage component as described with reference to FIGS. 7 through 9.

At block 1220 the memory array 100 may operate the first ferroelectric memory cell in a volatile mode based at least in part on storing the logic state. The operations of block 1220 may be performed according to the methods described with reference to FIGS. 2 through 5. In certain examples, examples of the operations of block 1220 may be performed by a volatile operator as described with reference to FIGS. 7 through 9.

Figure 13:
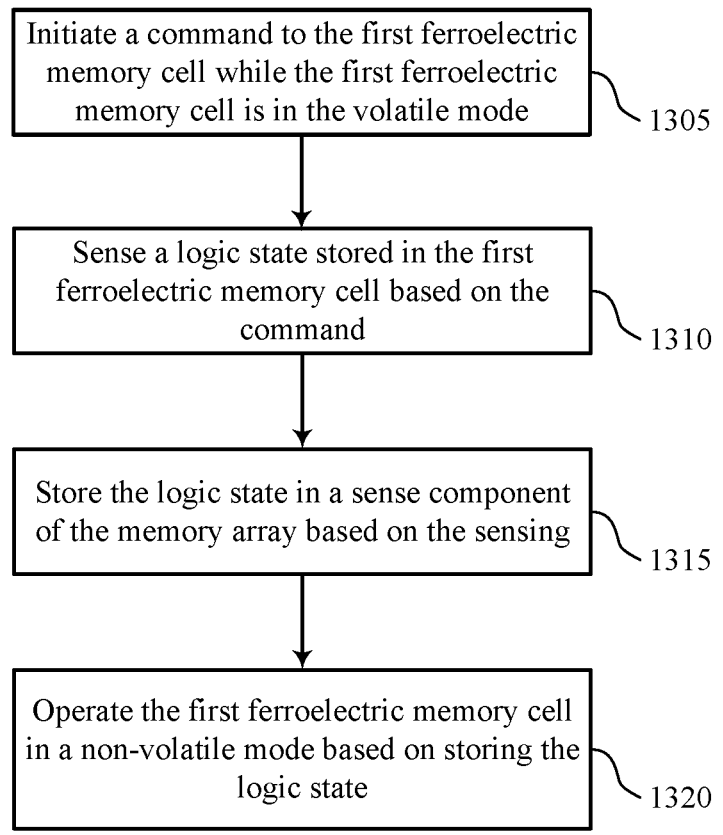

FIG. 13 shows a flowchart illustrating a method 1300 for dual mode ferroelectric memory cell operation in accordance with various examples of the present disclosure. The operations of method 1300 may be implemented by a memory array 100 or its components as described herein. For example, the operations of method 1300 may be performed by a memory controller as described with reference to FIGS. 7 through 9. In some examples, a memory array 100 may execute a set of codes to control the functional elements of the device to perform the functions described below. Additionally or alternatively, the memory array 100 may perform examples of the functions described below using special-purpose hardware.

At block 1305 the memory array 100 may initiate a command to the first ferroelectric memory cell while the first ferroelectric memory cell is in the volatile mode. The operations of block 1305 may be performed according to the methods described with reference to FIGS. 2 through 5. In certain examples, examples of the operations of block 1305 may be performed by a command component as described with reference to FIGS. 7 through 9.

At block 1310 the memory array 100 may sense a logic state stored in the first ferroelectric memory cell based at least in part on the command. The operations of block 1310 may be performed according to the methods described with reference to FIGS. 2 through 5. In certain examples, examples of the operations of block 1310 may be performed by a sense component as described with reference to FIGS. 7 through 9.

At block 1315 the memory array 100 may store the logic state in a sense component of the memory array based at least in part on the sensing. The operations of block 1315 may be performed according to the methods described with reference to FIGS. 2 through 5. In certain examples, examples of the operations of block 1315 may be performed by a storage component as described with reference to FIGS. 7 through 9.

At block 1320 the memory array 100 may operate the first ferroelectric memory cell in a non-volatile mode based at least in part on storing the logic state. The operations of block 1320 may be performed according to the methods described with reference to FIGS. 2 through 5. In certain examples, examples of the operations of block 1320 may be performed by a non-volatile operator as described with reference to FIGS. 6 through 9.

It should be noted that the methods described above describe possible implementations, and that the operations and the steps may be rearranged or otherwise modified and that other implementations are possible. Furthermore, examples from two or more of the methods may be combined. The method 1300 may further include writing data in a non-volatile mode, reading data in a non-volatile mode, and refreshing data in a non-volatile mode, among other operations, in a non-volatile mode. In some cases, the method 1300 may include writing data in a volatile mode, reading data in a volatile mode, and refreshing data in a volatile mode, among other operations, in a volatile mode.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

A method of operating a memory array is described. The method may include operating a ferroelectric memory cell of a memory array in a non-volatile mode, initiating a first command while operating the ferroelectric memory cell in the non-volatile mode, and operating the ferroelectric memory cell in a volatile mode based at least in part on the first command.

An apparatus for operating a memory array is described. The apparatus may include means for operating a ferroelectric memory cell of a memory array in a non-volatile mode, means for initiating a first command while operating the ferroelectric memory cell in the non-volatile mode, and means for operating the ferroelectric memory cell in a volatile mode based at least in part on the first command.

Another apparatus for operating a memory array is described. The apparatus may include a memory cell and a memory controller in electronic communication with the memory cell, wherein the memory controller is operable to operate a ferroelectric memory cell of a memory array in a non-volatile mode, initiate a first command while operating the ferroelectric memory cell in the non-volatile mode, and operate the ferroelectric memory cell in a volatile mode based at least in part on the first command. In some examples of the method and apparatus described above, initiating the first command comprises: selecting a first portion of the memory array.

Some examples of the method and apparatus described above may further include processes, features, means, or instructions for sensing a first logic state of the ferroelectric memory cell based at least in part on the first command. Some examples of the method and apparatus described above may further include processes, features, means, or instructions for storing the sensed first logic state in a storage component associated with the ferroelectric memory cell.

Some examples of the method and apparatus described above may further include processes, features, means, or instructions for initiating a second command while operating the ferroelectric memory cell in the volatile mode. Some examples of the method and apparatus described above may further include processes, features, means, or instructions for operating the ferroelectric memory cell in the non-volatile mode based at least in part on the second command.

In some examples of the method and apparatus described above, initiating the second command comprises: deselecting a first portion of the memory array.

Some examples of the method and apparatus described above may further include processes, features, means, or instructions for operating a second ferroelectric memory cell of the memory array in the non-volatile mode while operating the ferroelectric memory cell in the volatile mode. Some examples of the method and apparatus described above may further include processes, features, means, or instructions for operating a second ferroelectric memory cell of the memory array in the volatile mode while operating the ferroelectric memory cell in the volatile mode.

Some examples of the method and apparatus described above may further include processes, features, means, or instructions for determining whether the ferroelectric memory cell may be in the non-volatile mode or the volatile mode at a first time. Some examples of the method and apparatus described above may further include processes, features, means, or instructions for determining whether a second ferroelectric memory cell of the memory array may be in the non-volatile mode or the volatile mode at the first time.

Some examples of the method and apparatus described above may further include processes, features, means, or instructions for adjusting an operation mode of the second ferroelectric memory cell based at least in part on determining whether the second ferroelectric memory cell may be in the non-volatile mode or the volatile mode.

A method of operating a memory array is described. The method may include initiating a first command while operating a ferroelectric memory cell of a memory array in a non-volatile mode, sensing a first logic state of the ferroelectric memory cell based at least in part on the first command, storing the sensed first logic state in a storage component associated with the ferroelectric memory cell, and operating the ferroelectric memory cell in a volatile mode after the storing.

An apparatus for operating a memory array is described. The apparatus may include means for initiating a first command while operating a ferroelectric memory cell of a memory array in a non-volatile mode, means for sensing a first logic state of the ferroelectric memory cell based at least in part on the first command, means for storing the sensed first logic state in a storage component associated with the ferroelectric memory cell, and means for operating the ferroelectric memory cell in a volatile mode after the storing.

Another apparatus for operating a memory array is described. The apparatus may include a memory cell and a memory controller in electronic communication with the memory cell, wherein the memory controller is operable to initiate a first command while operating a ferroelectric memory cell of a memory array in a non-volatile mode, sense a first logic state of the ferroelectric memory cell based at least in part on the first command, store the sensed first logic state in a storage component associated with the ferroelectric memory cell, and operate the ferroelectric memory cell in a volatile mode after the storing.

Some examples of the method and apparatus described above may further include processes, features, means, or instructions for determining an operation mode of the first ferroelectric memory cell based at least in part on the command. Some examples of the method and apparatus described above may further include processes, features, means, or instructions for initiating a refresh command to the first portion of the memory array based at least in part on determining the operation mode.

Some examples of the method and apparatus described above may further include processes, features, means, or instructions for operating a second ferroelectric memory cell in a second portion of the memory array in the non-volatile mode while operating the first ferroelectric memory cell in the volatile mode, the second portion of the memory array different from the first portion of the memory array.

Some examples of the method and apparatus described above may further include processes, features, means, or instructions for pre-charging a digit line associated with the first ferroelectric memory cell at a second reference voltage based at least in part on operating the first ferroelectric memory cell in the volatile mode.

Some examples of the method and apparatus described above may further include processes, features, means, or instructions for initiating a second command while operating the ferroelectric memory cell in the volatile mode. Some examples of the method and apparatus described above may further include processes, features, means, or instructions for sensing a second logic state of the ferroelectric memory cell based at least in part on the second command. Some examples of the method and apparatus described above may further include processes, features, means, or instructions for writing the sensed second logic state to the ferroelectric memory cell.

Some examples of the method and apparatus described above may further include processes, features, means, or instructions for operating the ferroelectric memory cell in the non-volatile mode after the storing based at least in part initiating the second command.

Some examples of the method and apparatus described above may further include processes, features, means, or instructions for applying a first reference voltage to the ferroelectric memory cell based at least in part on a first portion of the memory array operating in the non-volatile mode. Some examples of the method and apparatus described above may further include processes, features, means, or instructions for applying a second reference voltage different from the first reference voltage of the ferroelectric memory cell based at least in part on the first portion of the memory array operating in the volatile mode.

Some examples of the method and apparatus described above may further include processes, features, means, or instructions for initiating the first command occurs automatically based on a power level of a ferroelectric memory device. In some examples, the power level may indicate that the device is powered on. In other examples, the power level may indicate that the device is powered off.

A method of operating a memory array is described. The method may include initiating a command to the first ferroelectric memory cell while the first ferroelectric memory cell is in a volatile mode, sensing a logic state stored in the first ferroelectric memory cell based at least in part on the command, storing the logic state in a sense component of the memory array based at least in part on the sensing, and operating the first ferroelectric memory cell in a non-volatile mode based at least in part on storing the logic state.

An apparatus for operating a memory array is described. The apparatus may include means for initiating a command to the first ferroelectric memory cell while the first ferroelectric memory cell is in a volatile mode, means for sensing a logic state stored in the first ferroelectric memory cell based at least in part on the command, means for storing the logic state in a sense component of the memory array based at least in part on the sensing, and means for operating the first ferroelectric memory cell in a non-volatile mode based at least in part on storing the logic state.

Another apparatus for operating a memory array is described. The apparatus may include a memory cell and a memory controller in electronic communication with the memory cell, wherein the memory controller is operable to initiate a command to the first ferroelectric memory cell while the first ferroelectric memory cell is in a volatile mode, sense a logic state stored in the first ferroelectric memory cell based at least in part on the command, store the logic state in a sense component of the memory array based at least in part on the sensing, and operate the first ferroelectric memory cell in a non-volatile mode based at least in part on storing the logic state.

Some examples of the method and apparatus described above may further include processes, features, means, or instructions for determining an operation mode of the first ferroelectric memory cell based at least in part on the command. Some examples of the method and apparatus described above may further include processes, features, means, or instructions for initiating a refresh command to the first portion of the memory array based at least in part on determining the operation mode.

Some examples of the method and apparatus described above may further include processes, features, means, or instructions for operating a second ferroelectric memory cell in a second portion of the memory array in the volatile mode while operating the first ferroelectric memory cell in the non-volatile mode, the second portion of the memory array different from the first portion of the memory array.

Some examples of the method and apparatus described above may further include processes, features, means, or instructions for biasing a first digit line of the first ferroelectric memory cell to a first voltage based at least in part on sensing the logic state. Some examples of the method and apparatus described above may further include processes, features, means, or instructions for biasing the first digit line of the first ferroelectric memory cell to a second voltage different from the first voltage based at least in part on sensing the logic state. In some examples of the method and apparatus described above, the first voltage may be greater than the second voltage.

Some examples of the method and apparatus described above may further include processes, features, means, or instructions for pre-charging a digit line associated with the first ferroelectric memory cell at a second reference voltage based at least in part on operating the first ferroelectric memory cell in the volatile mode.

In one embodiment, a memory array may include a first ferroelectric memory cell configured to operate in a volatile operation mode and in a non-volatile operation mode, the first ferroelectric memory cell in a first portion of a memory array, a transistor coupled to the first ferroelectric memory cell, a sense component in electronic communication with the first ferroelectric memory cell, and a switch in electronic communication with the first ferroelectric memory cell, the switch configured to select a first cell plate associated with the non-volatile operation mode or a second cell plate associated with the volatile operation mode.

A method of operating a memory array is described. The method may include forming a first ferroelectric memory cell configured to operate in a volatile operation mode and in a non-volatile operation mode, the first ferroelectric memory cell in a first portion of a memory array, forming a transistor coupled to the first ferroelectric memory cell, forming a sense component in electronic communication with the first ferroelectric memory cell, and forming a switch in electronic communication with the first ferroelectric memory cell, the switch configured to select a first cell plate associated with the non-volatile operation mode or a second cell plate associated with the volatile operation mode.

Some examples of the memory array described above may also include a timing component in electronic communication with the sense component, the timing component to provide a timing signal associated with the non-volatile operation mode or the volatile operation mode to the sense component at a first time. Some examples of the undefined described above may also include a second switch in electronic communication with the timing component, wherein the timing component provides the timing signal using the switch.

Some examples of the memory array described above may also include a voltage component in electronic communication with the sense component, the voltage component to provide a reference voltage associated with the non-volatile operation mode or the volatile operation mode to the sense component at a first time. Some examples of the undefined described above may also include a third switch in electronic communication with the voltage component, wherein the voltage component provides the reference voltage using the switch.

Some examples of the memory array described above may also include a word line in electronic communication with the first ferroelectric memory cell and a second ferroelectric memory cell, the word line to select the first ferroelectric memory cell and the second ferroelectric memory cell. In some examples described above, the first ferroelectric memory cell and the second ferroelectric memory cell operate in the volatile operation mode.

What is claimed is:

1. An apparatus, comprising:
   a first ferroelectric memory cell configurable to operate in a volatile operation mode and in a non-volatile operation mode;
   a transistor coupled to the first ferroelectric memory cell;
   a sense component in electronic communication with the first ferroelectric memory cell;
   a timing component in electronic communication with the sense component, the timing component to provide a timing signal associated with the non-volatile operation mode or the volatile operation mode to the sense component at a first time; and
   a first switch in electronic communication with the first ferroelectric memory cell, the first switch configured to selectively connect the first ferroelectric memory cell with a second switch associated with operating the first ferroelectric memory cell in the non-volatile operation mode or with a third switch associated with operating the first ferroelectric memory cell in the volatile operation mode.

2. The apparatus of claim 1, further comprising:
   a fourth switch in electronic communication with the timing component, wherein the timing component provides the timing signal using the fourth switch.

3. The apparatus of claim 1, further comprising:
   a voltage component in electronic communication with the sense component, the voltage component to provide a reference voltage associated with the non-volatile operation mode or the volatile operation mode to the sense component at a second time.

4. The apparatus of claim 3, further comprising:
   a fifth switch in electronic communication with the voltage component, wherein the voltage component provides the reference voltage using the fifth switch.

5. The apparatus of claim 1, further comprising:
a word line in electronic communication with the first ferroelectric memory cell and a second ferroelectric memory cell, the word line to select the first ferroelectric memory cell and the second ferroelectric memory cell.

6. The apparatus of claim 5, wherein the first ferroelectric memory cell and the second ferroelectric memory cell operate in the volatile operation mode.

7. The apparatus of claim 5, wherein the first ferroelectric memory cell and the second ferroelectric memory cell operate in the non-volatile operation mode.

8. An apparatus, comprising:
a first ferroelectric memory cell configurable to operate in a volatile operation mode and in a non-volatile operation mode;
a transistor coupled to the first ferroelectric memory cell;
a controller coupled with the first ferroelectric memory cell and the transistor, the controller configured to cause the apparatus to:
select a first switch associated with operating the first ferroelectric memory cell in the non-volatile operation mode or a second switch associated with operating the first ferroelectric memory cell in the volatile operation mode, and
cause a timing component in electronic communication with a sense component to provide a timing signal associated with the non-volatile operation mode or the volatile operation mode to the sense component at a first time.

9. The apparatus of claim 8, wherein the controller is configured to cause the apparatus to select the first switch or the second switch by activating a third switch in electronic communication with the first ferroelectric memory cell.

10. The apparatus of claim 8, wherein the controller is configured to cause the apparatus to:
provide the timing signal by activating a fourth switch in electronic communication with the timing component.

11. The apparatus of claim 8, wherein the controller is configured to cause the apparatus to:
cause a voltage component in electronic communication with the sense component to provide a reference voltage associated with the non-volatile operation mode or the volatile operation mode to the sense component at a second time.

12. The apparatus of claim 11, wherein the controller is configured to cause the apparatus to:
provide the reference voltage by activating a fifth switch in electronic communication with the voltage component.

13. The apparatus of claim 8, further comprising:
a word line in electronic communication with the first ferroelectric memory cell and a second ferroelectric memory cell, wherein the controller is configured to cause the apparatus to select the first ferroelectric memory cell and the second ferroelectric memory cell by activating the word line.

14. The apparatus of claim 13, wherein the first ferroelectric memory cell and the second ferroelectric memory cell are configured to operate in the volatile operation mode.

15. The electronic memory apparatus of claim 13, wherein the first ferroelectric memory cell and the second ferroelectric memory cell are configured to operate in the non-volatile operation mode.

* * * * *